United States Patent

Iwane et al.

[11] Patent Number: 6,140,209
[45] Date of Patent: *Oct. 31, 2000

[54] PROCESS FOR FORMING AN SOI SUBSTRATE

[75] Inventors: Masaaki Iwane; Takao Yonehara, both of Atsugi; Kazuaki Ohmi, Yokohama, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/045,955

[22] Filed: Mar. 23, 1998

[30] Foreign Application Priority Data

Mar. 26, 1997 [JP] Japan .................................. 9-073770

[51] Int. Cl.$^7$ .......................... H01L 21/304; H01L 21/20
[52] U.S. Cl. .......................... 438/458; 438/507; 438/765; 438/960; 438/974; 438/977; 148/33.4
[58] Field of Search ........................... 148/33, 33.2, 33.4, 148/33.5; 438/409, 455, 456, 457, 459, 478, 507, 765, 795, 960, 974, 976, 977

[56] References Cited

U.S. PATENT DOCUMENTS 5,371,037 12/1994 Yonehara .
5,374,564 12/1994 Bruel .

FOREIGN PATENT DOCUMENTS 0 320 868 6/1989 European Pat. Off. .
0 757 377 2/1997 European Pat. Off. .
7-302889 11/1995 Japan .
8-213645 8/1996 Japan .

OTHER PUBLICATIONS

Database WPIL on QUESTEL, week 9040, London: Derwent Publication Ltd., AN 90–301116(40), class B26F.
Database WPIL on QUESTEL, week 8638, London: Derwent Publication Ltd., AN 86–249608(38), class C04B.
T. Yonehara, "Epitaxial layer transfer by bond and etch back of porous Si", Appl. Phys. Lett., vol. 64, No. 16, pp. 2108–2110 (1994).

*Primary Examiner*—Charles Bowers
*Assistant Examiner*—Keith Christianson
*Attorney, Agent, or Firm*—Fitzpatrick, Cella, Harper & Scinto

[57] ABSTRACT

A process for producing an SOI substrate is disclosed which is useful for saving resources and lowering production cost. Further, a process for producing a photoelectric conversion device such as a solar cell is disclosed which can successfully separate a substrate by a porous Si layer, does not require a strong adhesion between a substrate and a jig, and can save resources and lower production cost. In a substrate having a porous layer on a nonporous layer and further having on the porous layer a layer small in porosity, the nonporous layer and the layer small in porosity are separated by the porous layer to form a thin film. A metal wire is wound around a side surface of the substrate, and a current is made to flow into the metal wire to generate a heat from the metal wire and transfer the heat preferentially to the porous layer, thus conducting the separation. The separated substrate is used for producing an SOI substrate and the separated nonporous Si layer is reutilized in a process of producing an SOI substrate.

51 Claims, 22 Drawing Sheets

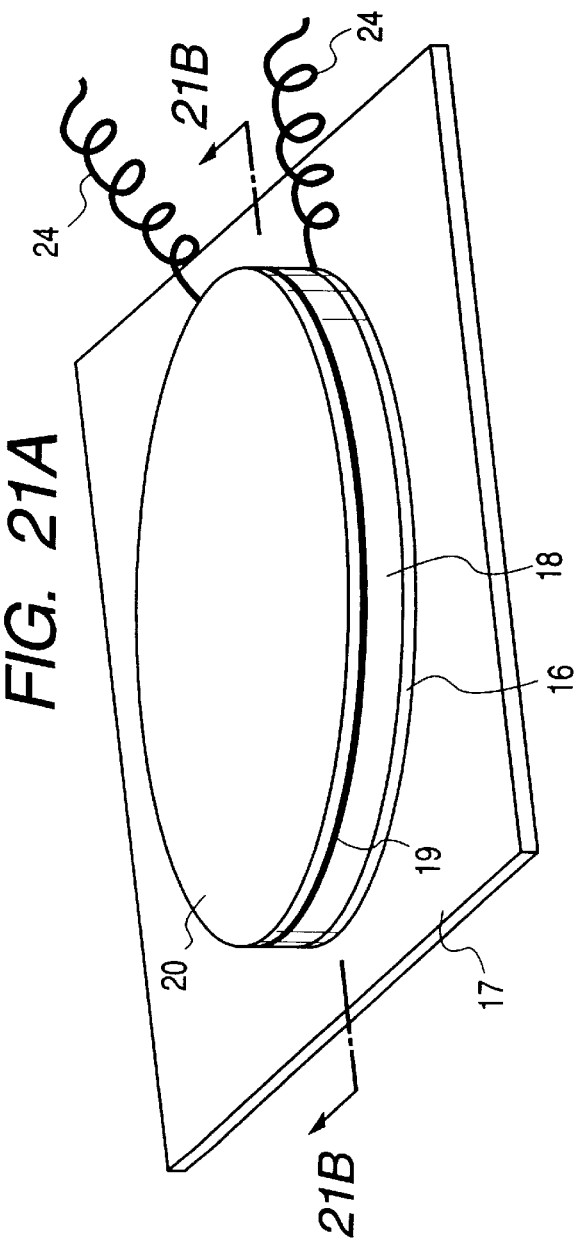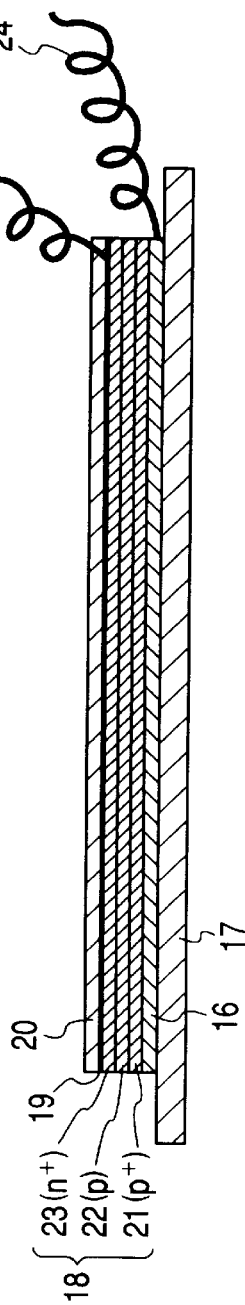

PROCESS FOR FORMING AN SOI SUBSTRATE

BACKGROUND OF THE INVENTION

1. Field of the Invention

The present invention relates to a process for forming a thin film used for an SOI substrate or a photoelectric conversion device such as a solar cell or an area sensor.

2. Related Background Art

An integrated circuit formed on a substrate having an SOI (Semiconductor On Insulator) structure has a variety of advantages in comparison with an integrated circuit formed on an ordinary Si wafer. For example, (1) dielectric isolation can be made easily to enable high integration, (2) it is excellent in radiation resistance, (3) floating capacitance can be reduced to enable high speed operation, (4) a well forming step can be omitted, (5) latch up can be prevented, and (6) since a complete depletion type electric field effect transistor can be formed by thin film formation, high speed operation and low power consumption can be attained.

As a process of producing a substrate with the SOI structure, there is a process such as disclosed in U.S. Pat. No. 5,371,037 or in Applied Physics Letters, vol. 64, p.2108 (T. Yonehara et al., Appl. Phys. Lett. vol.64, 2108 (1994)). FIGS. 22A to 22E and FIGS. 23A to 23D show the production process. In the figures, reference numerals 1 and 5 denote Si wafers; 2, a nonporous Si layer; 3, a porous Si layer; 4, an epitaxial Si layer; 6, a single crystal Si layer; and 7, an Si oxide layer. First, the Si wafer 1 that forms a device substrate is prepared as shown in FIG. 22A, which is then anodized to fabricate a substrate having the porous Si layer 3 formed on a surface of the nonporous Si layer 2 as shown in FIG. 22B. Then, the epitaxial Si layer 4 is formed on a surface of the porous Si layer 3 as shown in FIG. 22C. On the other hand, the Si wafer 5 that forms a support substrate is prepared as shown in FIG. 22D, and the surface thereof is oxidized to fabricate a substrate in which the Si oxide layer 7 is formed on a surface of the single crystal Si layer 6 as shown in FIG. 22E. Then, the substrate 2, 3 and 4 shown in FIG. 22C is turned over above the substrate 6 and 7 shown in FIG. 22E so that the epitaxial Si layer 4 and the Si oxide layer 7 are opposed to each other as shown in FIG. 23A, and both the substrates are bonded to each other with the epitaxial Si layer 4 and the Si oxide layer 7 in contact with each other, as shown FIG. 23B. Thereafter, the nonporous Si layer 2 is mechanically removed by grinding to expose the porous Si layer 3 as shown in FIG. 23C. Therefore, the porous Si layer 3 is wet etched with an etchant capable of selectively removing the porous Si layer 3 to remove the porous Si layer 3 as shown in FIG. 23D. As a result, the thickness of the epitaxial Si layer 4 which becomes a semiconductor layer on the underlying insulating layer becomes remarkably uniform.

In producing the substrate of the SOI structure, the above-described production process requires one substrate 1 every time one SOI substrate is produced because the nonporous Si layer 2 is removed by grinding during the transformation of the substrate shown in FIG. 23B into the substrate shown in FIG. 23C. Under this circumstance, there has been proposed in Japanese Patent Application Laid-Open No. 7-302889 that the nonporous Si layer 2 is used a plurality of times during the process of producing the SOI substrate. In other words, when transforming the substrate shown in FIG. 23B into the substrate shown in FIG. 23C, a process of exerting a tensile force, a squash force, a sharing force or the like on the substrate shown in FIG. 23B, of inserting a jig into the porous Si layer 3, or the like is used to separate the bonded layers 4, 7 and 6 which become an SOI substrate from the nonporous layer 2 via the porous Si layer 3. Thus, the remaining nonporous Si layer 2 is used a plurality of times as the Si wafer 1 shown in FIG. 22A.

On the other hand, although the main current of existing solar cells are those which use amorphous Si as a structure suitable for attaining a large area cell, attention has also been paid to a solar cell of single crystal Si or polycrystal Si from the standpoint of conversion efficiency and service life. Japanese Patent Application Laid-Open No. 8-213645 discloses a process of providing a thin film solar cell at a low cost. In the process, as shown in FIG. 24, a porous Si layer 3 is formed on an Si wafer 1, and then a $p^+$type Si layer 21, a p-type Si layer 22 and an $n^+$type Si layer 23 which become a solar cell layer are epitaxially grown on the porous Si layer 3. After a protective film 30 is formed on the $n^+$type Si layer 23, a jig 31 is made to adhere to a rear surface of the Si wafer 1 with an adhesive 34, and a jig 32 is made to adhere to a front surface of the protective film 30 with an adhesive 34. Subsequently, the jigs 31 and 32 are pulled in opposite directions as shown by P in FIG. 24 to mechanically break the porous Si layer 3, thereby separating the solar cell layers 21, 22 and 23 from the Si wafer 1. Then, the solar cell layers 21, 22 and 23 are disclosed to be interposed between two plastic substrates, thus producing a flexible thin film solar cell. It is further disclosed therein that the Si wafer 1 can be used several times. Also, there is disclosed that a partial cut 33 is formed on a side wall of the porous Si layer 3 by a mechanical process or irradiation with a laser beam prior to the application of a pulling force.

In producing an SOI substrate, the process disclosed in Japanese Patent Application Laid-Open No. 7-302889 mentioned above can reduce the cost because the Si wafer is used several times. However, this process is not that sufficient in actual operation.

On the other hand, according to the production process as disclosed in Japanese Patent Application Laid-Open No. 8-213645 mentioned above separation at the porous Si layer is not always made successfully. Therefore, there are many cases in which a crack is generated in the epitaxial layer, thus lowering the yield. Also, since the process achieves the separation by pulling the porous Si layer, a strong adhesion is required between the jig and the single crystal Si layer, which makes the process unsuitable for mass production.

SUMMARY OF THE INVENTION

It is an object of the present invention to provide a simple process which is capable of more surely separating substrates, of using an Si wafer without waste advantageously from the viewpoint of cost, and of effectively employing the resource of the earth.

The present inventors conducted intensive studies in order to solve the above problems and accomplished the following invention. Thus, according to the present invention, there is provided a process of forming a thin film which prepares a substrate having a porous layer on a nonporous layer and further having a layer smaller in porosity than the porous layer on the porous layer, and separates the nonporous layer and the layer smaller in porosity by the porous layer, the process comprising bringing a wire into contact with a side surface of the substrate to effect the separation. The wire may be wound on the side surface of the substrate at least once around. Here, the wire may be electrically conductive, and a current may be allowed to flow into the wire to generate heat from the wire. Also, the wire may be electrically conductive, and a current may be allowed to flow into the wire to thermally expand the wire. Further, the wire may be electrically conductive, and a current may be allowed to flow into the wire while applying a magnetic field to the outside of the wire, thereby exerting the Lorentz's force on the wire. In this case, the magnetic field may be a static magnetic field, and an alternating current may be allowed to flow into the wire to vibrate the wire. Also, the magnetic field may be a static magnetic field, and a direct current may be allowed to flow into the wire to exert a force on the substrate from the wire in a direction of peeling off the Si layer smaller in porosity. Further, the wire may be tightened to separate the substrate.

In the present invention, the wire may be a bimetal, and the wire may be heated to be thermally deformed to conduct the separation. Also, the wire may be a shape-memory alloy, and the wire may be deformed by using the shape-memory of the wire to conduct the separation.

It is desirable that the layer small in porosity is formed by epitaxial growth on the porous layer. Also, it is desirable that after the epitaxial layer and a support substrate having an insulating layer at least on a surface thereof are bonded to each other, separation is performed by the porous layer, and the porous layer remaining on the epitaxial layer is removed to use the epitaxial Si layer and the insulating layer for a semiconductor layer and an underlying insulating layer of the SOI substrate, respectively. It is desirable that the support substrate having an insulating film at least on a surface thereof is a substrate obtained by oxidizing a surface of an Si wafer. Also, it is possible that after an insulating layer is formed on a surface of the epitaxial layer and the insulating layer is bonded to the support substrate, the separation is made by the porous Si layer, and the porous layer remaining on the epitaxial layer is removed so that the epitaxial layer and the insulating layer are used for a semiconductor layer and an underlying insulating layer of an SOI substrate, respectively. In this case, the support substrate may be a substrate where a surface of an Si wafer is oxidized or a quartz substrate.

The layer smaller in porosity may be formed by conducting anodization at a smaller current density than that used when forming the porous layer at the time of the anodization of an Si wafer. At this time, it is possible that after the layer smaller in porosity and the support substrate are bonded to each other, the separation is made by the porous layer so that the layer smaller in porosity is used for the photoelectric conversion layer of a photoelectric conversion device. Further, at this time, the photoelectric conversion layer may be an epitaxial layer.

The above and other objects and features of the present invention will be more apparent from the following description taken in conjunction with the accompanying drawings.

BRIEF DESCRIPTION OF THE DRAWINGS

FIGS. 21A and 21B are a perspective view and a cross-sectional view of a single crystal Si solar cell, respectively;

DETAILED DESCRIPTION OF THE PREFERRED EMBODIMENTS

Now, a description will be given in more detail of preferred embodiments of the present invention with reference to the accompanying drawings.

First to twelfth embodiments of the present invention will be described. The first to eighth embodiments show modes of producing an SOI substrate, and the ninth to eleventh embodiments show modes of producing a photoelectric conversion unit such as a solar cell or an area sensor. The twelfth embodiment shows use of hydrogen ions. The present invention is not limited by or to only the respective embodiments; it also includes modes of combining the respective embodiments.

(First Embodiment)

The first embodiment is directed to a mode of producing an SOI substrate in which, in order to separate a wafer to be reused and an SOI substrate, an electrically conductive wire is wound around a side surface of a plate-like article having a porous layer, and a current is made to flow into the wire, thereby generating a heat from the wire. Then, the thermal expansion of the porous layer is induced by the heat to separate the substrate.

Figure 1A:
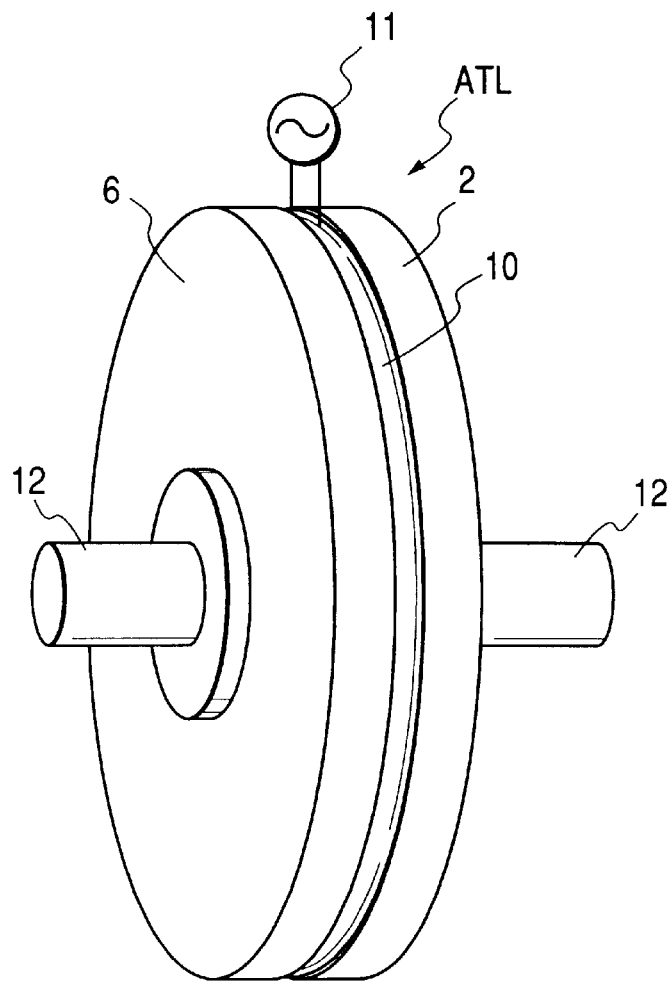
FIGS. 1A and 1B are views showing a separating process according to a first embodiment of the present invention where a nichrome wire is wound around a substrate.
Figure 1B:
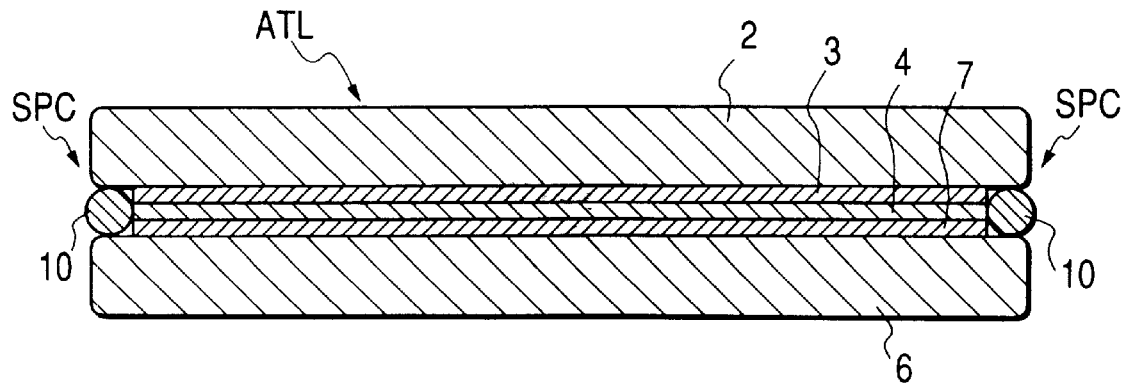

FIGS. 1A and 1B are views showing a separating process of this embodiment, in which FIG. 1A is a perspective view and FIG. 1B is a cross-sectional view thereof. In the figures, the same reference numerals as those in FIGS. 22A to 22E and 23A to 23D indicate identical members. Reference numeral 10 denotes a wire made of an electrically conductive material relatively high in resistivity such as a nichrome wire, and 11 is an AC power source that applies an alternating current to the wire 10. An article ATL which will be separated includes the respective layers 2, 3, 4, 7 and 6. Since this is a substrate obtained by bonding two wafers, the respective edge portions of which are chamfered, the side surface of the article ATL has a space SPC such as a recess as shown in the cross section of FIG. 1B. This is because the chamfered edge portions of the wafers are thinner than the inner portions thereof. Then, the nichrome wire 10 is wound around the article ATL in such a manner that the nichrome wire 10 is laid along the space SPC. The nichrome wire 10 may be wound around the article ATL only once around, or may be wound several times around in such a manner that the wire 10 fills up the space SPC.

Thereafter, an alternating current is made to flow into the nichrome wire 10 by means of the AC power source 11 to generate heat from the nichrome wire 10. Then, the heat is propagated to the porous Si layer 3, and its thermal expansion makes the porous Si layer 3 brittle, thereby separating the article ATL by the porous Si layer 3. In order to promote the separation, liquid such as water, alcohol, or IPA (isopropyl alcohol) may be injected and adsorbed into the pores of the porous Si layer 3. This is because the expansion of the liquid promotes the separation since the liquid has a larger thermal expansion coefficient than a solid such as Si. The power source 11 was described as an AC power source, but may be a DC power source.

Figure 2:
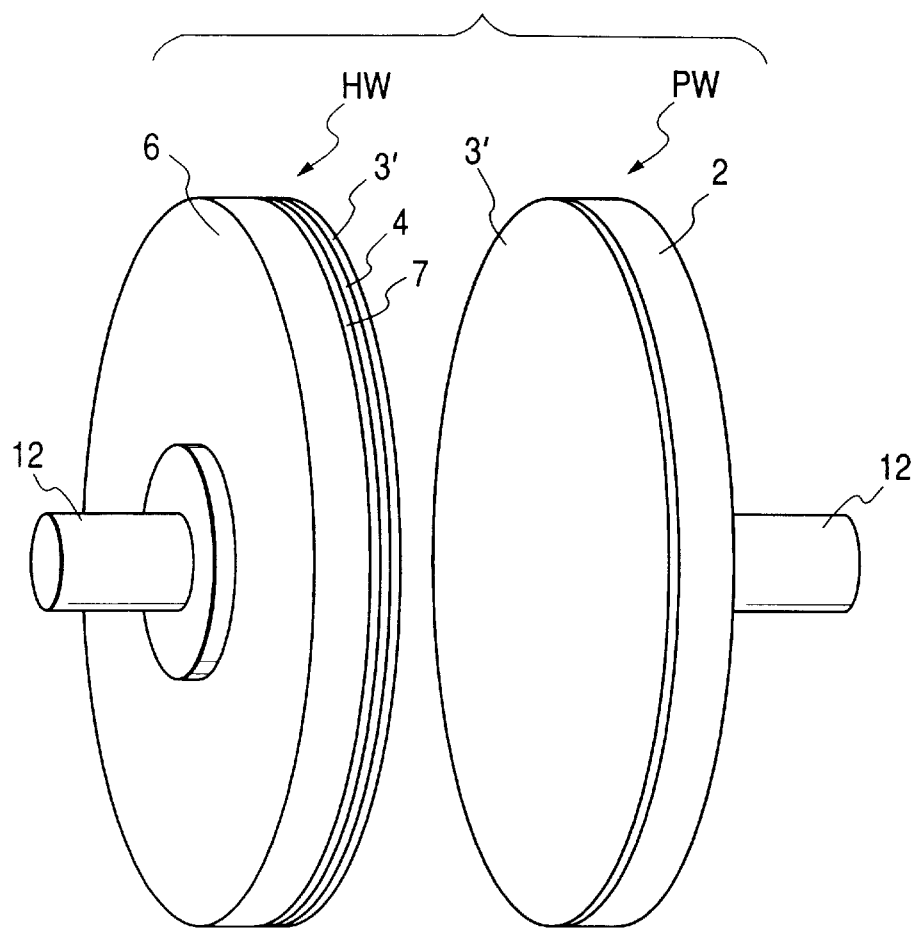
FIG. 2 is a view showing a device substrate and a support substrate after separation.

A vacuum chuck 12 that serves as a substrate holder has a space which contains a gas and is designed in such a manner that it is brought in contact with the respective outside surfaces of the nonporous layer 2 and the single crystal layer 6, and the gas can then be extracted from the inside of the vacuum chuck 12, thereby holding the article ATL to be separated. Here, in order to facilitate the separation, a small tensile force may be exerted on the substrate through the vacuum chuck 12. As a result of the above separating process, as shown in FIG. 2, a substrate HW that forms an SOI substrate and a substrate PW that will be reused can be separated with a boundary of the porous layer 3. In FIG. 2, porous Si layers 3' remain on the respective surfaces (separation surfaces) of the respective substrates. However, if the porous layer 3 is sufficiently reduced in thickness during the anodization process, it is possible that the remaining porous Si layer 3' does not remain on one or both of the substrates after the substrates are substantially separated.

Figure 3:
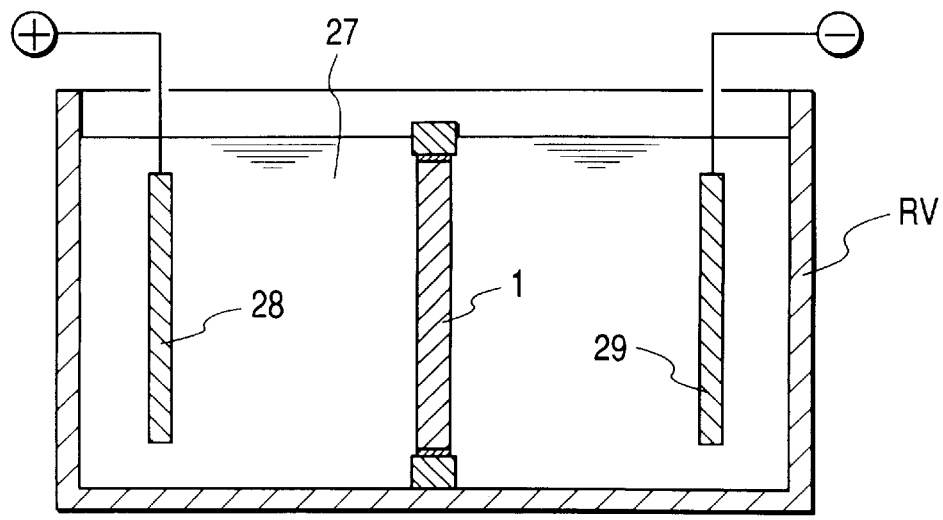
FIG. 3 is a view showing an anodization process that makes an Si wafer porous.

When an SOI substrate is formed, an Si wafer that forms a device substrate is first prepared. FIG. 3 is a cross-sectional view showing a device for anodizing an Si wafer. In the figure, reference numeral 1 denotes an Si wafer; 27, a hydrofluoric acid type etchant reserved in a reservoir RV; 28, a positive metal electrode; and 29, a negative metal electrode. The Si wafer 1 which is anodized is desirably of the p-type, but may be of the n-type if it is low in resistance. Also, even if it is the n-type Si wafer, the wafer can be made porous if holes are formed by irradiation with light. As shown in FIG. 3, the positive electrode 28 is located left, whereas the negative electrode 29 is located right, and a voltage is applied between the electrodes. When both the electrodes 28, 29 and the wafer 1 are disposed in parallel with each other such that an electric field induced by the voltage is applied in the direction perpendicular to a surface of the Si wafer 1, the Si wafer 1 is made porous from the negative electrode 29 side. The hydrofluoric acid type etchant 27 may be concentrated hydrofluoric acid (49% HF). Since during the anodization bubbles are generated from the Si wafer 1, for the purpose of efficiently removing the bubbles, it is preferable that an alcohol is added to the liquid 27 as a surface active agent. The alcohol to be added is desirably selected from methanol, ethanol, propanol, isopropanol and the like. Also, instead of the addition of the surface active agent, a stirrer may be used to conduct anodization with stirring. It is preferable that the thickness of the layer which is made porous is set to 0.1 to 30 $\mu$m.

It is desirable that the negative electrode 29 is made of a material which is not eroded by hydrofluoric acid solution, for example, gold (Au), platinum (Pt) or the like. Although the positive electrode 28 may be made of a metal material which is generally used, it is desirable that it is made of a material which is not eroded by hydrofluoric acid. The current density for anodization is 100 mA/cm$^2$ at the maximum, and the minimum value may be any one other than 0 (zero). The current density is set so that a high-quality epitaxial Si layer can be formed on the porous Si layer to be formed and so that the separation at the porous Si layer to be formed can easily be made. Specifically, when the current density in anodization for preparing porous Si is large, the density of Si of the formed porous Si layer is reduced. For that reason, the volume of the pores becomes larger as the current density is large, whereby the porosity (which is defined by a rate of the volume of pores to the total volume of the porous layer) becomes large. Although the porous Si layer has a large number of pores inside of the Si layer, the single-crystallinity (i.e., monocrystallinity) thereof is maintained. Therefore, it is possible to epitaxially grow a single crystal Si layer on a porous Si layer.

Figure 4:
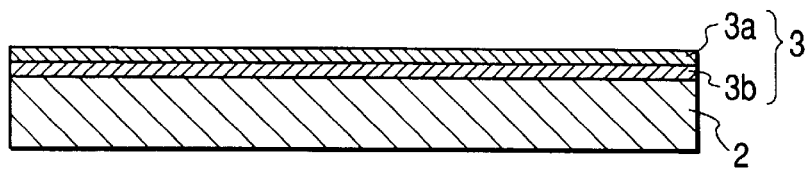
FIG. 4 is a cross-sectional view showing an ideal form of a porous Si layer.

However, in order to form an epitaxial Si layer having no stacking fault, it is preferable that the porosity of the porous Si layer in contact with the epitaxial Si layer is small. On the other hand, in order to facilitate the separation between the device substrate and the SOI substrate with the boundary of the porous Si layer, it is preferable that the porosity of the porous Si layer is large. In other words, it is ideal that the porosity of the porous Si layer is small on the outermost surface side thereof, and the porosity of the porous Si layer 3 is large on a side close to the nonporous Si layer. FIG. 4 is a cross-sectional view showing the ideal form of the porous Si layer, where a porous Si layer 3a small in porosity is formed on the surface side of the porous Si layer 3, and a porous Si layer 3b large in porosity is formed on the nonporous Si layer 2 side of the porous Si layer 3. In order to form this structure, anodization is conducted at a small current density at an initial stage where the layer 3a is formed, and anodization is conducted at a large current density at a post stage where the layer 3b is formed. With this structure, the separation surface of the substrate will be formed at the layer 3b. Further, an epitaxial Si layer having no stacking fault can be formed on the porous Si layer 3a. It is desirable that the epitaxial Si layer is formed by a method such as molecular beam epitaxial growth, plasma CVD, low pressure CVD, photo CVD, bias sputtering, liquid phase growth or like, especially a low temperature growth method.

Figure 5A:
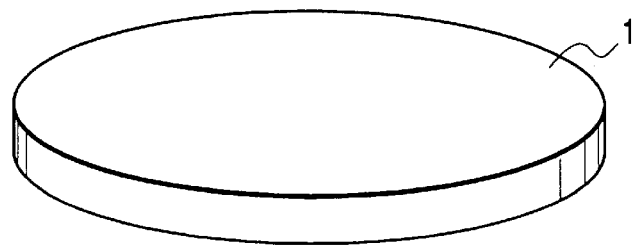
FIGS. 5A, 5B, 5C and 5D are views showing a processing conducted for a device substrate before bonding.
Figure 5B:
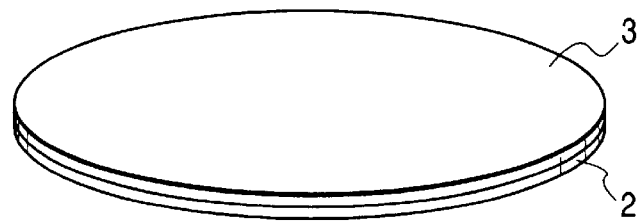

According to the above-described process, an Si wafer 1 is prepared as shown in FIG. 5A, and its surface is made porous as shown in FIG. 5B. In this way, the Si wafer 1 is changed into a structure in which a porous Si layer 3 is stacked on a nonporous Si layer 2.

Figure 5C:
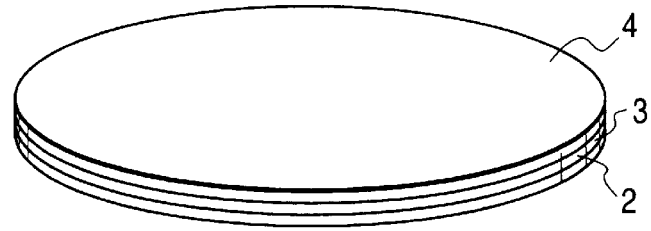

Subsequently, as shown in FIG. 5C, a nonporous epitaxial Si layer 4 is formed on the porous Si layer 3.

Figure 5D:
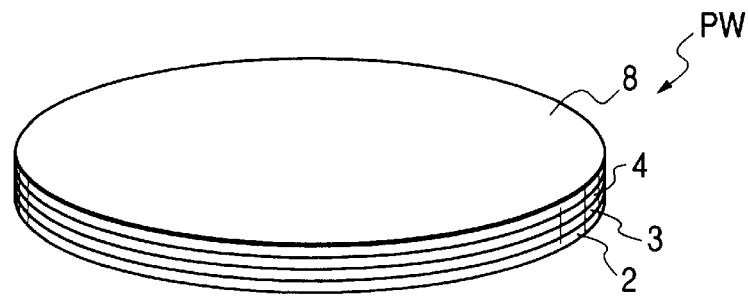

Then, as the occasion demands, the surface of the epitaxial Si layer 4 is thermally oxidized to form an Si oxide layer 8 which is 0.05 to 2 $\mu$m in thickness, as shown in FIG. 5D.

The above is a processing conducted for the substrate PW called "prime wafer", "bond wafer" or "device substrate" before the bonding.

The processing for the substrate HW called "handle wafer", "base wafer" or "support substrate" is as follows:

An Si wafer is prepared, and as the occasion demands, its surface is thermally oxidized to form on a surface of the Si wafer an Si oxide film 0.05 to 3 $\mu$m in thickness.

Subsequently, referring to FIGS. 6A to 6D, the steps of bonding and separating the substrates will be described.

Figure 6A:
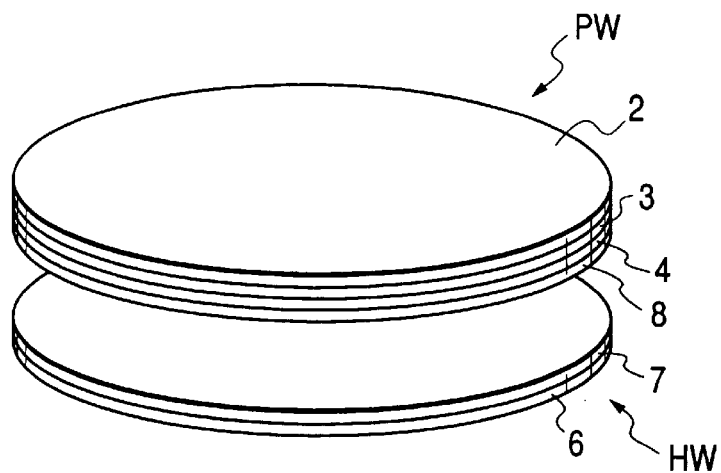
FIGS. 6A, 6B, 6C and 6D are views showing steps of bonding and separating a device substrate and a support substrate.

As shown in FIG. 6A, a surface of the Si oxide layer 8 on the epitaxial Si layer 4 of the substrate PW and a surface of the Si oxide layer 7 of the substrate HW are opposed to each other, and they are bonded to each other at room temperature. Thereafter, through anodic bonding, pressurizing, heat treatment or a combination thereof, the Si oxide layer 8 and the Si oxide layer 7 are firmly bonded together to form an article ATL consisting of bonded substrates as shown in FIG. 6B.

Figure 6B:
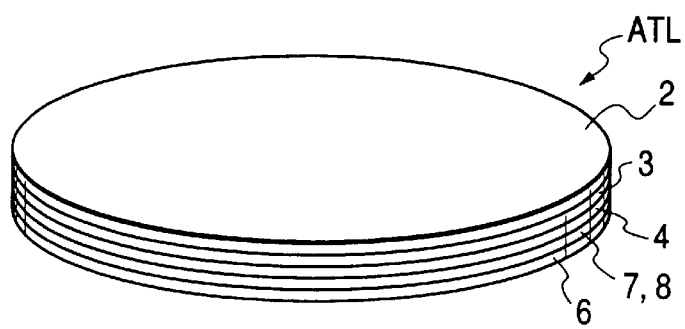

Then, the bonded article ATL having the structure shown in FIG. 6B is mounted on the vacuum chuck 12 of the apparatus shown in FIGS. 1A and 1B, and a wire is wound around the side surface of the article ATL. The wire is positioned so as to be in contact with the side surface of the porous Si layer 3.

Then, a current is allowed to flow into the wire, thereby generating heat. The heat is used to heat the porous Si layer which is in contact with the wire and thermally expands the porous Si layer.

Due to thermal expansion of the porous Si layer, the article ATL begins to separate from the side surface thereof with the boundary of the porous Si layer.

Figure 6C:
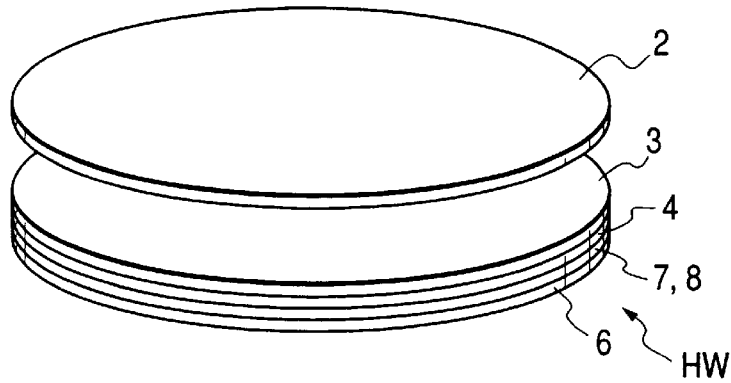

In this way, as shown in FIG. 6C, the nonporous Si layer 2 of the substrate PW is separated from the substrate HW. In this state, the epitaxial Si layer 4 has been transferred to the surface of the substrate HW.

There is a case where the porous Si layer 3 remains on at least either one of the side of the separated nonporous Si layer 2 and the side of the surface of the epitaxial Si layer 4. FIG. 6C shows a state in which the porous Si layer 3 remains only on the surface of the epitaxial Si layer 4.

When the porous Si layer 3 is formed in a sufficiently small thickness during the anodization process, the porous Si layer 3 substantially remains on neither of the substrates after the separation.

Figure 6D:
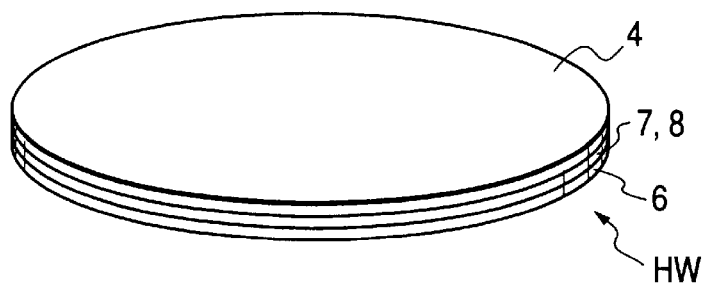

In the case where the porous Si layer 3 remains, the porous Si layer 3 remaining on the substrate HW side is removed by selective etching. In the selective etching, if electroless wet chemical etching is conducted using hydrofluoric acid, a mixture solution in which alcohol is mixed with hydrofluoric acid, a mixture solution in which aqueous hydrogen peroxide solution is mixed with hydrofluoric acid, or the like as an etchant, the porous Si layer is etched more than the nonporous Si layer. In particular, when the mixture solution is used in which aqueous hydrogen peroxide solution is mixed with hydrofluoric acid, the selective etching ratio of the porous Si layer to the nonporous Si layer becomes ~$10^5$. In this manner, as shown in FIG. 6D, the epitaxial Si layer 4 uniform in thickness remains on the surface of the substrate HW. Thus, as shown in FIG. 6D, there remains the epitaxial layer 4 with a uniform thickness on the surface of the substrate HW. Therefore, there can be obtained an SOI substrate having an extremely uniform semiconductor layer on an insulating layer.

The nonporous Si layer 2 as separated is reused as a prime wafer in order to manufacture another SOI substrate.

Figure 7A:
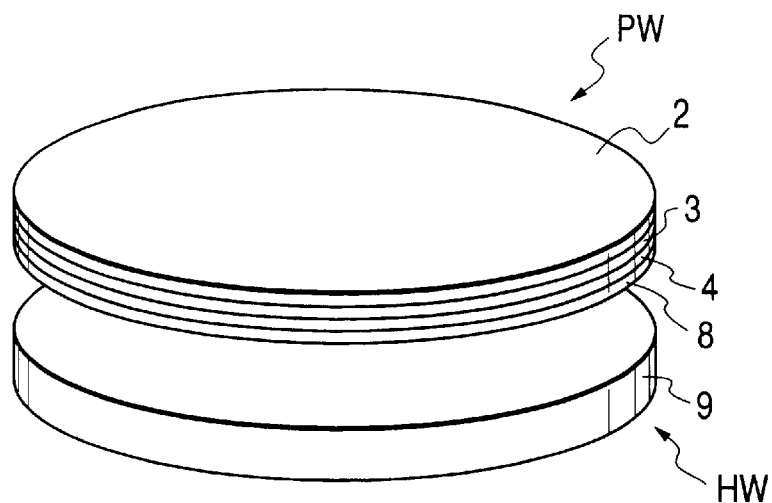
FIGS. 7A, 7B, 7C and 7D are views showing a process of producing an SOI substrate using a wholly insulating substrate as a support substrate.
Figure 7B:
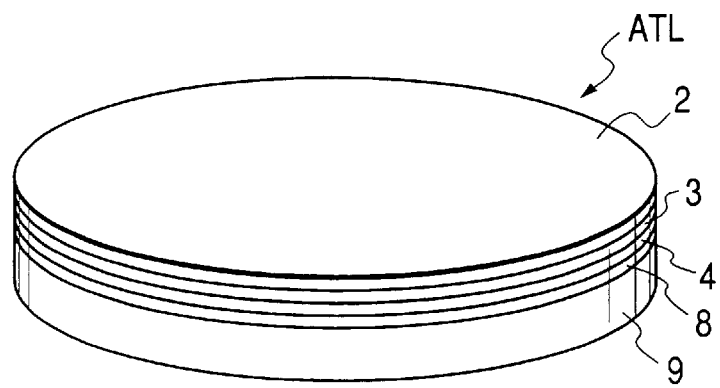

Also, in the process of producing the SOI substrate according to this embodiment, the support substrate may be a wholly insulating substrate such as a glass or quartz substrate. FIGS. 7A to 7D are views showing a process of producing the SOI substrate in the case where the quartz substrate is used as the support substrate. The device substrate PW shown as an upper portion in FIG. 7A is produced in the same manner as described with reference to FIGS. 5A to 5D. Then, the quartz substrate 9 forming the support substrate HW is opposed to the Si oxide layer 8, and the quartz substrate 9 and the Si oxide layer 8 are brought in close contact with each other as shown in FIG. 7B (the Si oxide layer 8 is not clearly depicted). Then, the Si oxide layer 8 and the quartz substrate 9 are firmly bonded to each other through anodic bonding, pressurizing, heat treatment or a combination thereof.

Figure 7C:
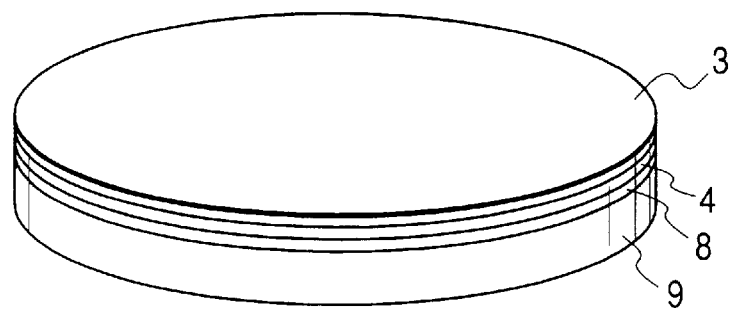

Thereafter, in the same manner as described above, a current is made to flow into a wire to heat the wire, thereby separating both substrates. The epitaxial Si layer 4 and the porous Si layer 3 have been transferred from the substrate PW and remain on the quartz substrate 9 as shown in FIG. 7C.

Figure 7D:
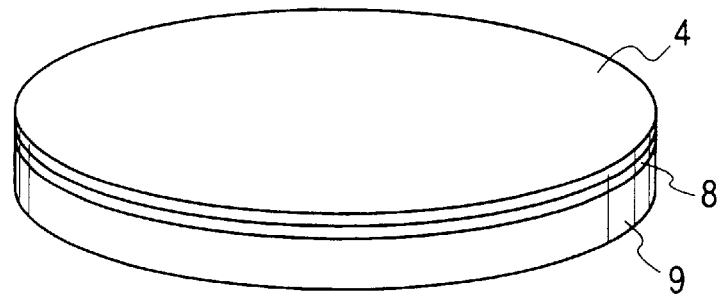

Furthermore, through the above-described process, the remaining porous Si layer 3 is selectively removed. In this way, an SOI substrate having a nonporous single crystal Si thin film on the quartz substrate 9 is obtained as shown in FIG. 7D.

Figure 8A:
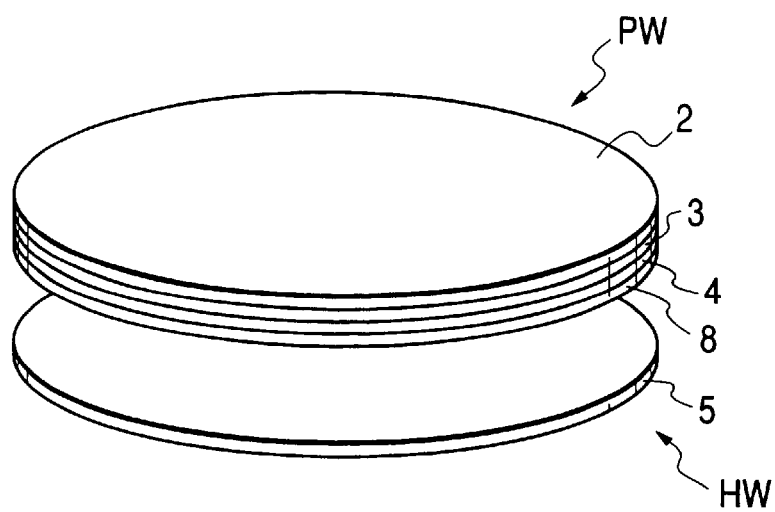
FIGS. 8A, 8B, 8C and 8D are views showing a process of producing an SOI substrate using an Si wafer as a support substrate.
Figure 8B:
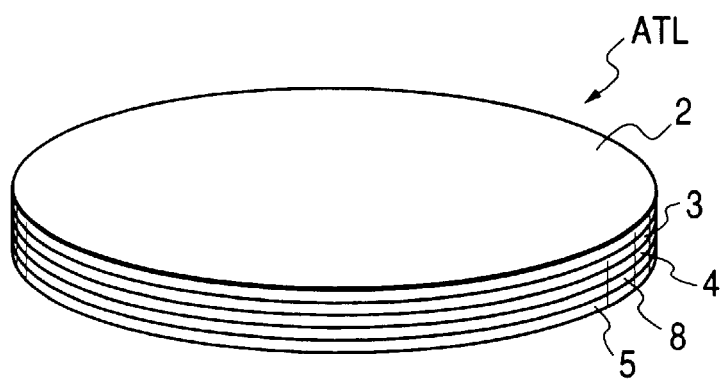

In addition, in the process of producing the SOI substrate according to this embodiment, an Si wafer may be used for the support substrate, while an Si oxide layer may be formed on the epitaxial Si layer of the device substrate side without forming an Si oxide layer on the Si wafer side, thereby forming an insulating layer with the SOI structure. FIGS. 8A to 8D show this process. The device substrate as shown on the top portion of FIG. 8A is produced in the same manner as described above with reference to FIGS. 5A to 5D. Then, a surface of a single crystal Si layer 5 formed of the Si wafer is opposed to the surface of the Si oxide layer 8 as shown in FIG. 8A, and the surface of the single crystal Si layer 5 and the surface of the Si oxide layer 8 are brought in close contact with each other and bonded to each other. In this case, it is preferable that the Si oxide layer 8 and the single crystal Si layer 5 are firmly bonded to each other through anodic bonding, pressurizing, heat treatment or a combination thereof. Thus, the article ATL is obtained as shown in FIG. 8B.

Figure 8C:
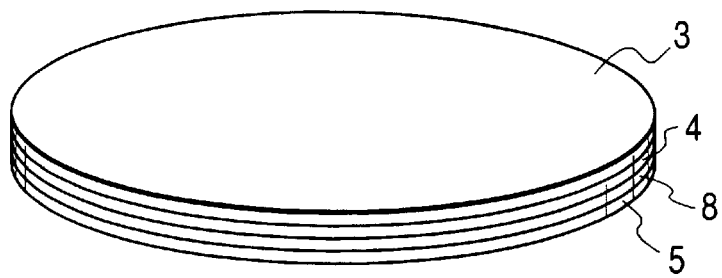
Figure 8D:
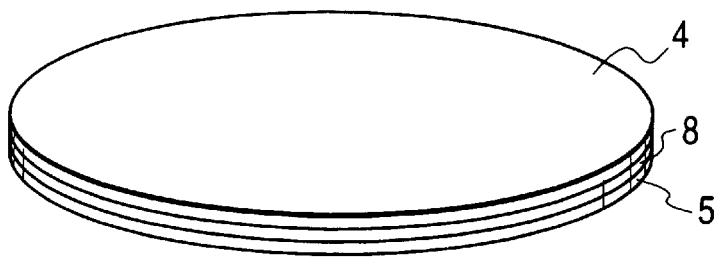

Then, using the apparatus shown in FIGS. 1A and 1B, a wire is brought into contact with the side surface of the porous Si layer and heated by allowing a current to flow into the wire so that the article ATL is separated at the boundary of the porous Si layer, as a result of which the epitaxial Si layer 4 formed of nonporous single crystal Si is transferred to the nonporous Si layer 5 side which is the support substrate HW. In this state, when the porous Si layer 3 remains on the epitaxial Si layer 4 on the support substrate HW as shown in FIG. 8C, selective removal of the porous Si layer through the above-described process provides an SOI substrate shown in FIG. 8D.

In the first embodiment, a nichrome wire as the wire is wound around the substrate to generate a heat. However, the wire is not limited by or to a nichrome wire, but may be made of any electrically conductive material such as a tantalum wire, as long as it is high in heat resistance and large in resistivity. Also, in the first embodiment, an AC power source is used as a power source, but a DC power source may be used instead. According to the first embodiment, since the extremely simple structure consisting of a nichrome wire and a power source enables the separation of the substrate, the production cost can be made low.
(Second Embodiment)

The second embodiment is directed to a mode of producing an SOI substrate in which, in order that an article ATL is separated into an Si wafer to be reused and a substrate which will finally form an SOI substrate at a porous Si layer, the thermal expansion of a wire is utilized. For that reason, a wire obtained by coating an electrically conductive wire with a resin large in thermal expansion coefficient is wound around the substrate, and a current is made to flow into the conductive wire.

Figure 9A:
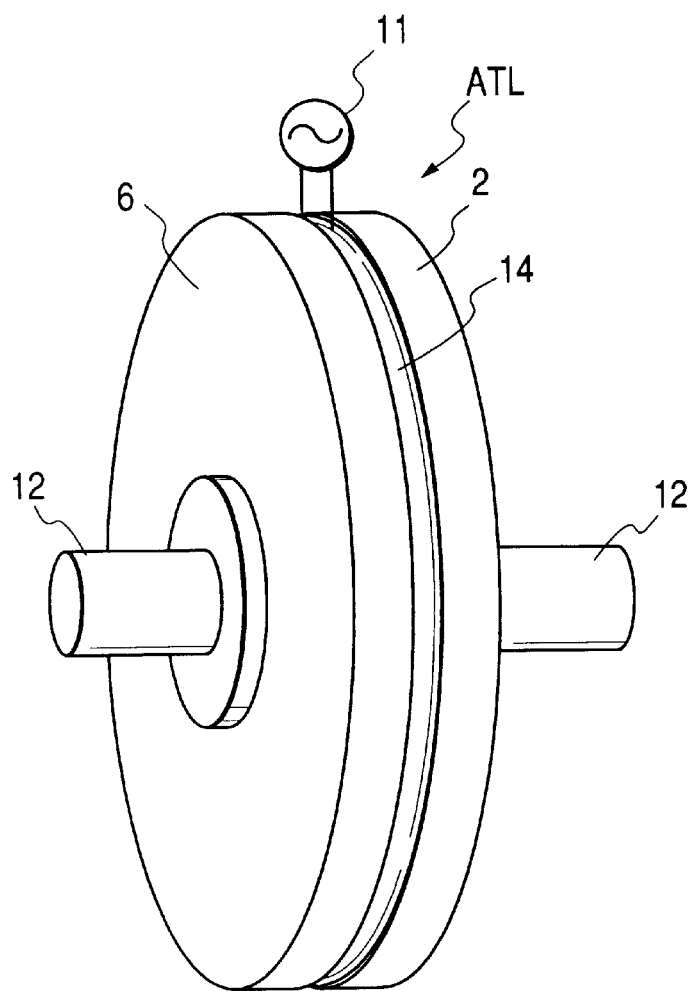
FIGS. 9A and 9B are views showing a separating process according to a second embodiment of the present invention where a thermally expandable wire is wound around a substrate.
Figure 9B:
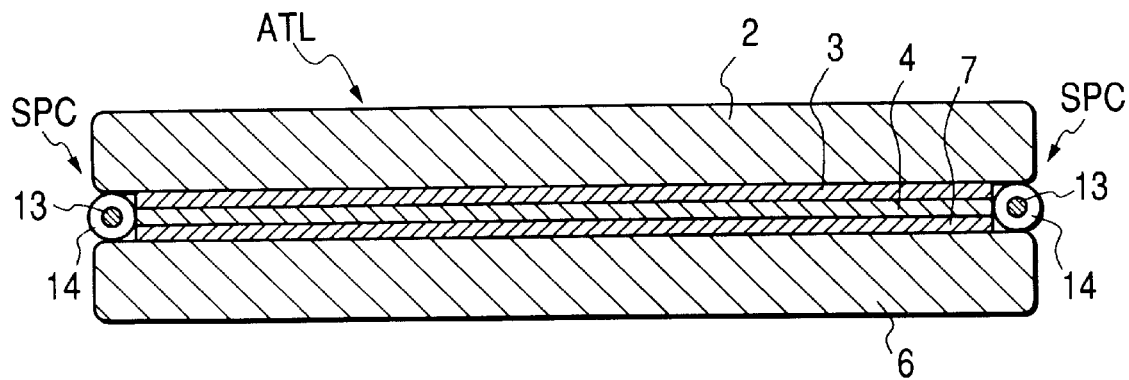

FIGS. 9A and 9B are views showing a separating process according to this embodiment, in which reference numeral 13 denotes a wire such as a nichrome heating wire coated with a plastic 14 of a large heat resistance. Other reference numbers denote the same members described with regard to FIGS. 1A and 1B. The separation of the article ATL is made as follows:

First, the heating wire 13 coated with plastic is wound in a space (recess) SPC between two substrates as chamfered on a side surface thereof. Then, a current is allowed to flow into the heating wire 13 from an AC power source 11 to thermally expand the plastic 14, thereby separating the nonporous Si layer 2 to be reused in a succeeding process of producing another SOI substrate from the parts 4, 7 and 6 which form an SOI substrate at the boundary of the porous Si layer 3. The subsequent steps are identical to those described for the first embodiment. In this embodiment, a heating wire coated with plastic is used as the wire; however, a wire made of a metal having a large thermal expansion coefficient such as brass may also be used.
(Third Embodiment)

The third embodiment is directed to a mode of producing an SOI substrate in which, in order that an article ATL is separated into an Si wafer to be reused and an SOI substrate at a porous Si layer, a wire that forms a bimetal is used. Then, the wire is heated to be thermally deformed to separate the substrate.

Figure 10A:
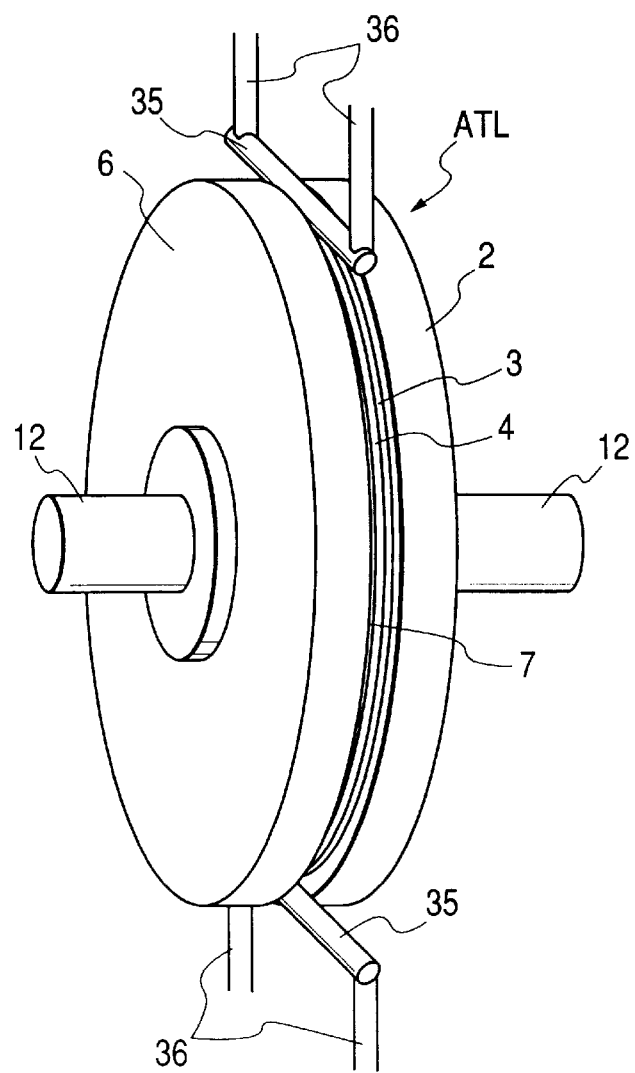
FIGS. 10A and 10B are views showing a separating process according to a third embodiment of the present invention where a wire formed of a bimetal is used.
Figure 10B:
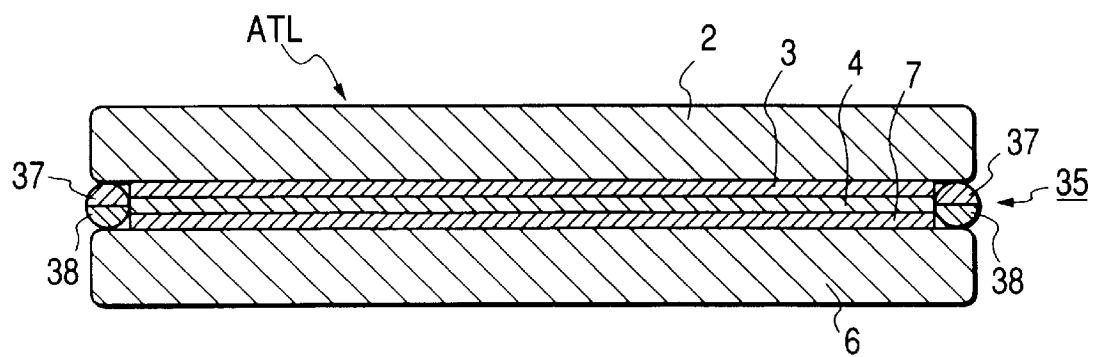
Figure 11A:
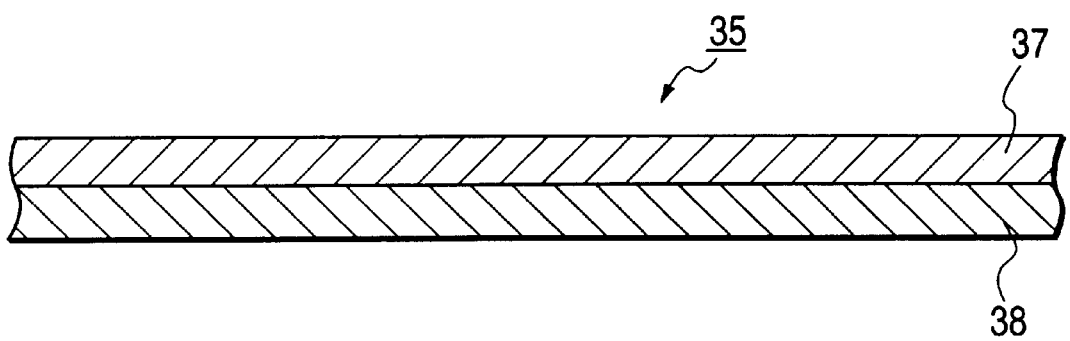
FIGS. 11A and 11B are views showing thermal deformation of a bimetal.
Figure 11B:
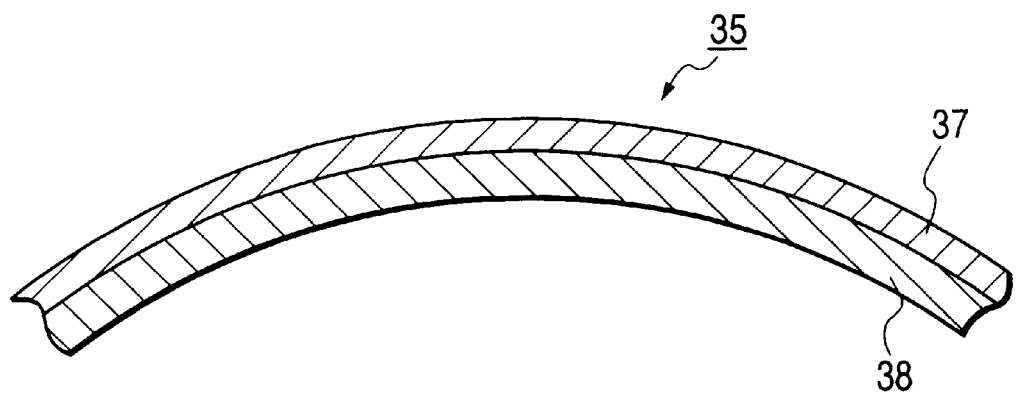

FIGS. 10A and 10B are a perspective view of a substrate showing a separating process of the third embodiment and a cross-sectional view of the substrate, respectively. In the figures, reference numeral 35 denotes a wire that forms a bimetal; 36, a support bar that supports the bimetal 35; 37, a brass that forms a bimetal 35 and has a large thermal expansion coefficient; and 38, an invar that forms the bimetal 35 and has a small thermal expansion coefficient. FIG. 11A shows the shape of the bimetal 35 at room temperature, and FIG. 11B shows the shape of the bimetal 35 when heated. When heated, the bimetal 35 is warped as shown in FIG. 11B because the brass 37 larger in thermal expansion coefficient will expand more than the invar 38 smaller in thermal expansion coefficient.

The bimetal 35 is supported by the support bar 36 at room temperature as shown in FIG. 10A and then inserted into a space SPC formed between the chamfered Si wafer 2 and the chamfered Si wafer 6. Then, the bimetal 35 is heated. The heating may be effected by elevating the atmospheric temperature or by making a current flow into the bimetal 35 through the support bar 36 to attain Joule heating. The heat permits the bimetal 35 flat at room temperature as shown in FIG. 11A to be warped as shown in FIG. 11B. As a result, a force is exerted on the Si wafer 2 and the Si wafer 6 in opposite directions so as to pull apart from the bimetal 35. In other words, as seen from the cross-sectional view of FIG. 10B, the Si wafer 2 receives a force upward from the bimetal 35, and the Si wafer 6 receives a force downward from the bimetal 35. As a result, a crack occurs in the porous Si layer 3 having the weakest bonding force between the Si wafer 2 and the Si wafer 6, thereby separating the substrate 2 to be reused from the substrate 4, 6 and 7 which forms an SOI substrate.
(Fourth Embodiment)

The fourth embodiment is directed to a mode of producing an SOI substrate in which, in order that an article ATL is separated into an Si wafer to be reused and an SOI substrate at a porous Si layer, a wire made of a shape-memory alloy is used. Then, the wire made of a shape-memory alloy is cooled to be contracted to separate the substrate.

Figure 12A:
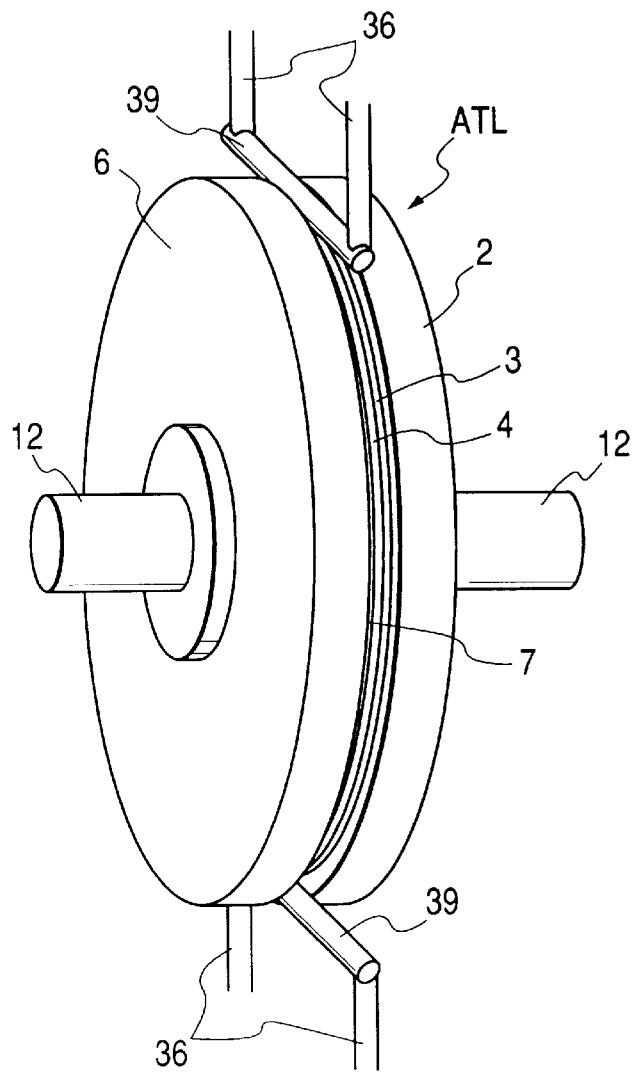
FIGS. 12A and 12B are views showing a separating process according to a fourth embodiment of the present invention where a shape-memory alloy is used.
Figure 12B:
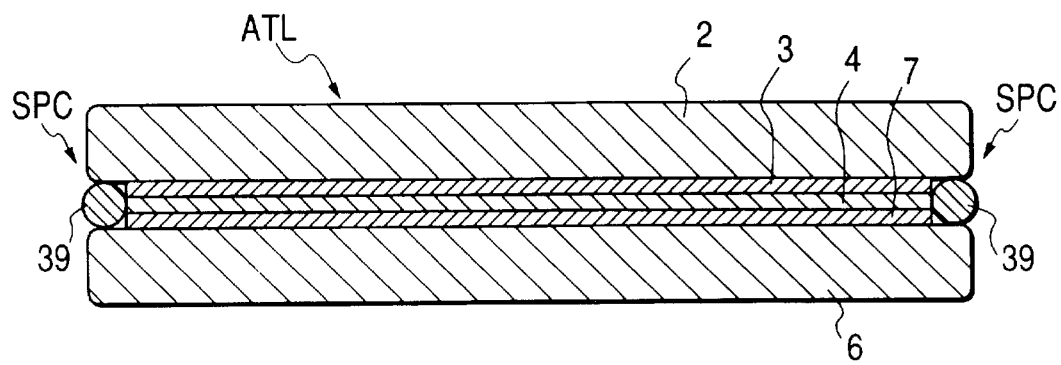
Figure 13A:
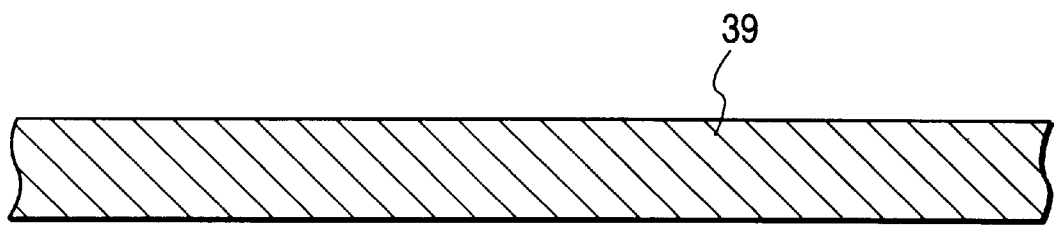
FIGS. 13A and 13B are views showing the thermal deformation of a shape-memory alloy.
Figure 13B:
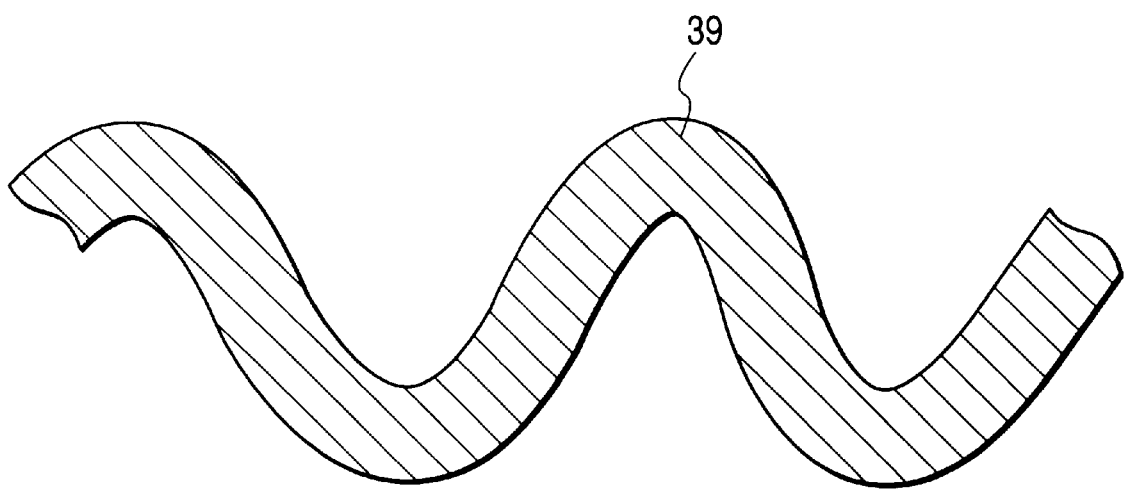

FIGS. 12A and 12B are views showing a separating process of the fourth embodiment, in which FIG. 12A is a perspective view of the substrate, and FIG. 12B is a cross-sectional view of the substrate, respectively. In the figures, reference numeral 39 denotes a wire made of a Ti—Ni alloy which is a shape-memory alloy. Alternatively, the wire may be another shape-memory alloy such as a Cu—Zn—Al alloy. FIG. 13A shows the shape of the wire 39 made of the shape-memory alloy at room temperature, and FIG. 13B shows the shape of the shape-memory alloy wire 39 which is cooled. The shape-memory alloy wire 39 supported by the support bar 36 at room temperature as shown in FIG. 12A is inserted into a recess formed between the chamfered Si wafer 2 and the chamfered Si wafer 6 as shown in FIG. 12B. Then, the shape-memory alloy wire 39 is cooled. The cooling may be conducted by lowering the atmospheric temperature or by Peltier cooling using metals of different thermoelectromotive forces for the support bar 36, etc. The cooling permits the shape-memory alloy wire 39 flat as shown in FIG. 13A to assume a waved shape as shown in FIG. 13B. As a result, a force is exerted on the Si wafer 2 and the Si wafer 6 in opposite directions so as to pull apart from the shape-memory alloy wire 39. In other words, when viewed by the cross-sectional view of FIG. 12B, the Si wafer 2 receives a force upward from the shape-memory alloy wire 39, and the Si wafer 6 receives a force downward from the shape-memory alloy wire 39. As a result, a crack occurs in the porous Si layer 3 with the weakest bonding force between the Si wafer 2 and the Si wafer 6, thereby separating the substrate 2 to be reused from the substrate 4, 6 and 7 which forms an SOI substrate.
(Fifth Embodiment)

The fifth embodiment is directed to a mode of producing an SOI substrate in which, in order that an article ATL is separated into an Si wafer to be reused and an SOI substrate at a porous Si layer, a Lorentz's force exerted on a wire wound around the substrate is utilized. Then, the wire that receives the Lorentz's force gives a separation force to the substrate.

Figure 14A:
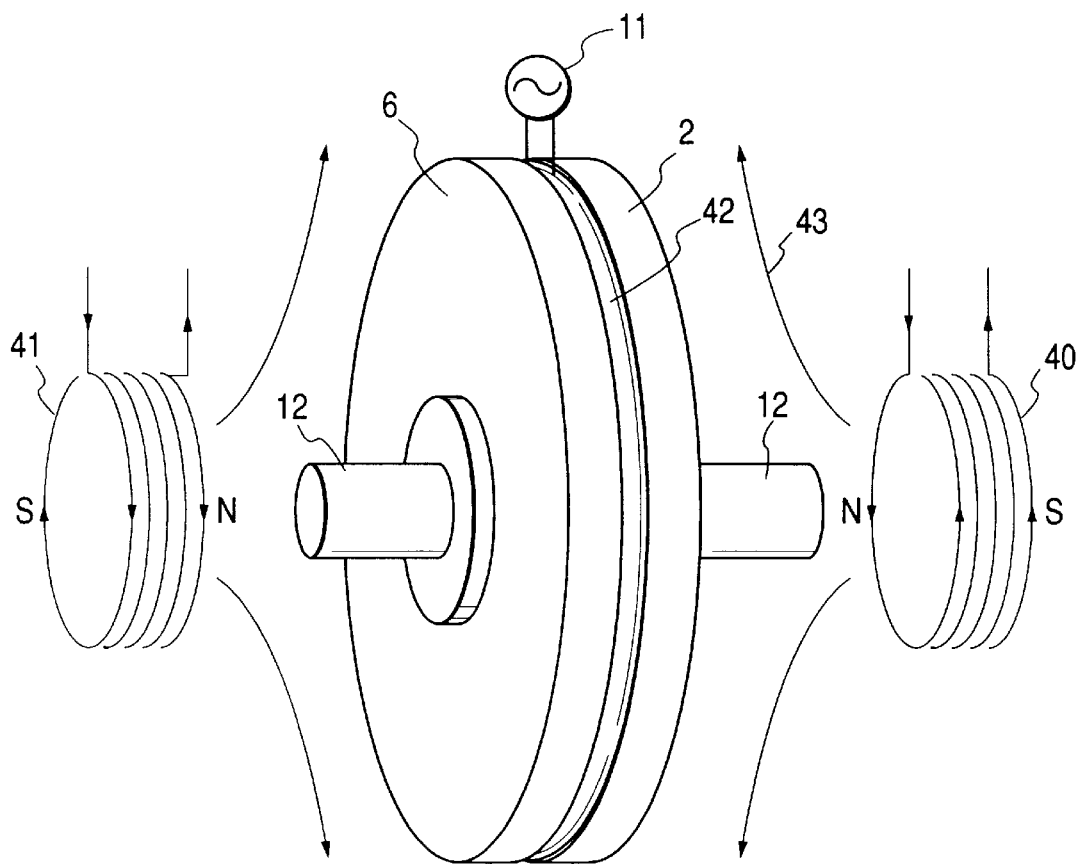
FIGS. 14A and 14B are views showing a separating process according to a fifth embodiment of the present invention where the Lorentz's force is exerted on a wire wound around a substrate.
Figure 14B:
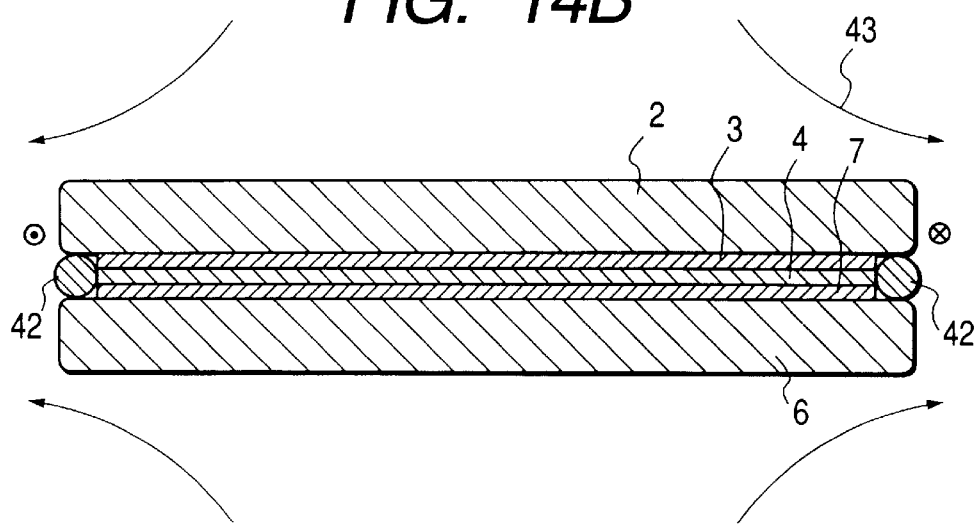

FIGS. 14A and 14B are views showing a separating process of the fifth embodiment, in which FIG. 14A is a perspective view of the substrate, and FIG. 14B is a cross-sectional view of the substrate, respectively. In the figures, reference numerals 40 and 41 denote electromagnets that generate a static magnetic field, and 42 is a conductor that receives the Lorentz's force from the static magnetic field which is a wire of the present invention. Reference numeral 43 denotes lines of magnetic force representing the static magnetic field generated by the electromagnets 40 and 41. In this example, it is desirable that the electromagnets 40 and 41 are superconductive electromagnets that give a strong magnetic field. The conductor 42 is wound around the bonded substrate at least once around so that it is inserted into a space formed between the Si wafer 2 and the Si wafer 6 as shown in FIG. 14B. Then, an alternating current is made to flow into the conductor 42 by an AC power source 11, whereby the bonded substrate receives Lorentz's force that vibrates vertically due to the static magnetic field 43, as viewed in the cross-sectional view of FIG. 14B. In other words, when viewed in the cross-sectional view of FIG. 14B, the Si wafer 2 receives a force upward from the conductor 42, and the Si wafer 6 receives a force downward from the conductor 42. As a result, a crack occurs in the porous Si layer 3 which is weakest in bonding force between the Si wafer 2 and the Si wafer 6, thereby separating the substrate 2 to be reused from the substrate 4, 6 and 7 which form an SOI substrate. In this embodiment, it is possible that an alternating current is supplied to the electromagnets 40 and 41, and a direct current is supplied to the conductor 42 to vibrate the conductor 42.

(Sixth Embodiment)

The sixth embodiment is directed to a mode of producing an SOI substrate in which, in order that an article ATC is separated into an Si wafer to be reused and an SOI substrate at a porous Si layer, a Lorentz's force exerted on a conductor wound around a substrate is utilized. Then, the conductor that receives the Lorentz's force gives a separation force to the substrate.

Figure 15A:
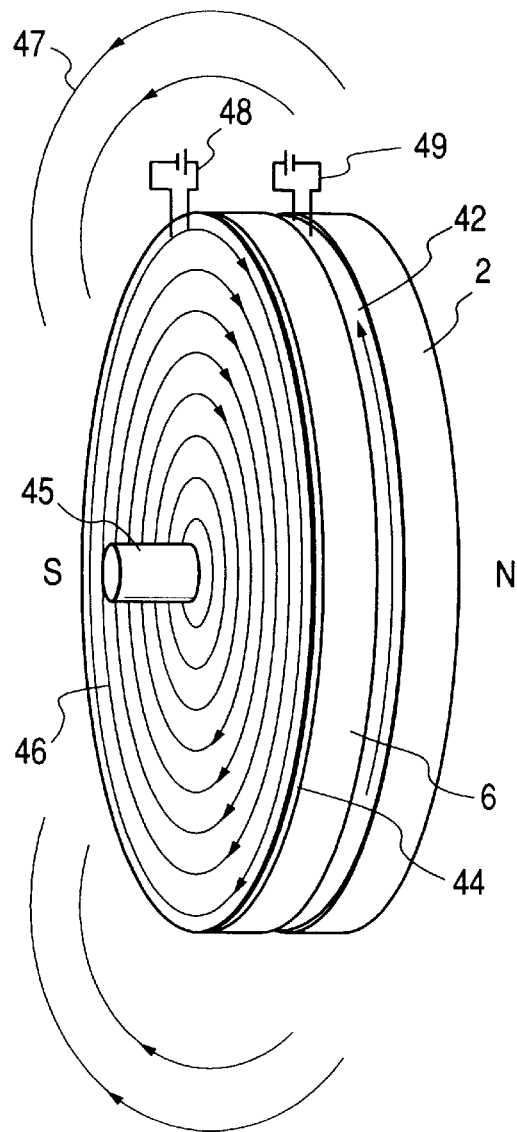
FIGS. 15A and 15B are views showing a separating process according to a sixth embodiment of the present invention where the Lorentz's force is exerted on a wire wound around a substrate.
Figure 15B:
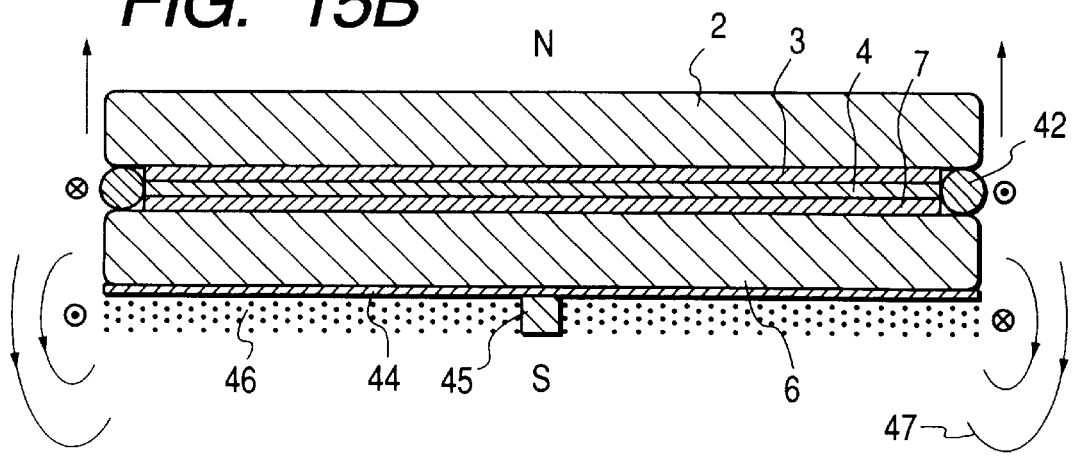

FIGS. 15A and 15B are views showing a separating process of the sixth embodiment, in which FIG. 15A is a perspective view of the substrate, and FIG. 15B is a cross-sectional view of the substrate, respectively. In the figures, reference numeral 44 denotes a chuck that supports the Si wafer 6 and also supports a conductor 46 that constitutes an electromagnet; 45, a center axis of the conductor 46 that constitutes the electromagnet; 47, lines of magnetic force of a static magnetic field developed by the electromagnet 46; and 42 is a conductor that receives the Lorentz's force from the static magnetic field which is a wire of the present invention. Reference numeral 48 denotes a DC power source that allows a current to flow into the electromagnet, and 49 is a DC power source that allows a current to flow into the conductor 42. The conductor 46 constituting the electromagnet is wound on the Si wafer 6 through the chuck 44 with the center axis 45 as a center. It is desirable that the center axis 45 is conductive to strengthen the static magnetic field 47. A direct current is made to flow from the DC power source 48 as shown in FIGS. 15A and 15B, thereby developing the static magnetic field 47 such that the Si wafer 2 side is N, and the chuck 44 side is S. The conductor 42 is wound around the bonded substrate at least once around so that it is inserted into a space formed between the Si wafer 2 and the Si wafer 6 as shown in FIG. 15B. Then, a current is made to flow into the conductor 42 by the DC power source 49 as shown in FIGS. 15A and 15B. As a result, the conductor 42 receives from the static magnetic field 47 such a Lorentz's force as to give a force in a direction of peeling off the Si wafer 2 from the Si wafer 6. In other words, when viewed in the cross-sectional view of FIG. 15B, the Si wafer 2 receives a force upward from the conductor 42, and the Si wafer 6 is fixed by chuck 44. As a result, a crack occurs in the porous Si layer 3 which is weakest in bonding force between the Si wafer 2 and the Si wafer 6, thereby separating the substrate 2 to be reused from the substrate 4, 6 and 7 which form an SOI substrate.

(Seventh Embodiment)

The seventh embodiment is directed to a mode of producing an SOI substrate in which, in order that an article ATC is separated into an Si wafer to be reused and an SOI substrate at a porous Si layer, a Lorentz's force exerted on a conductor wound around a substrate is utilized. Then, the conductor that receives the Lorentz's force gives a separation force to the substrate as is the case with the sixth embodiment.

Figure 16A:
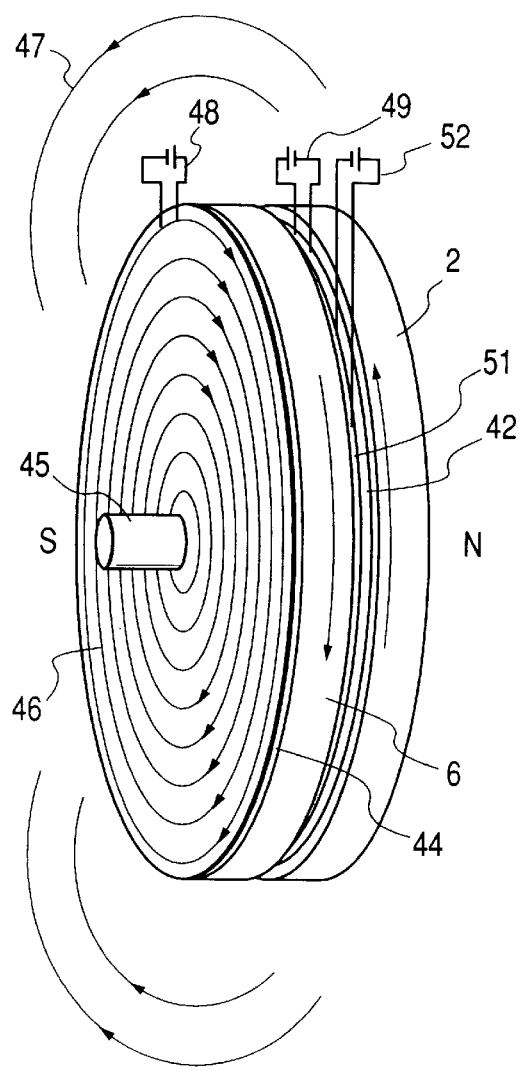
FIGS. 16A and 16B are views showing a separating process according to the seventh embodiment of the present invention where the Lorentz's force is exerted on a wire wound around a substrate.
Figure 16B:
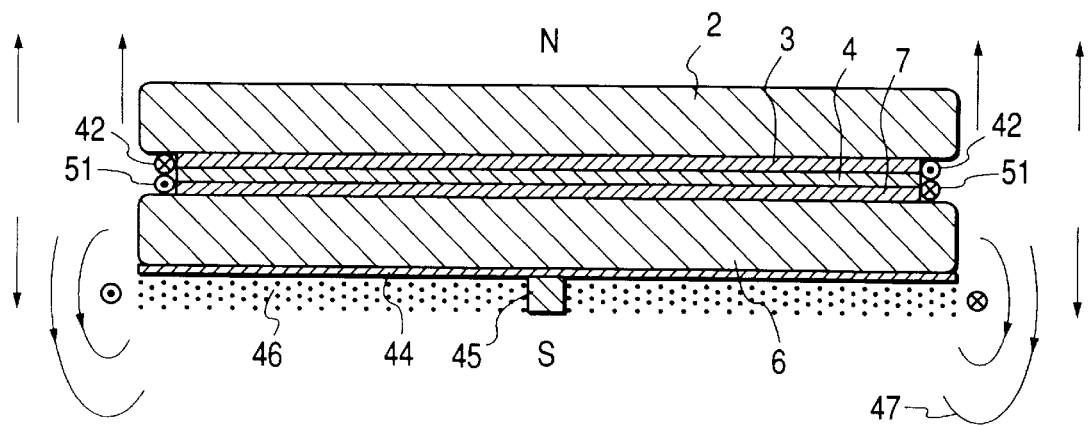

FIGS. 16A and 16B are views showing a separating process of the seventh embodiment, in which FIG. 16A is a perspective view of the substrate, and FIG. 16B is a cross-sectional view of the substrate, respectively. In the figures, reference numeral 44 denotes a chuck that supports the Si wafer 6 and also supports the conductor 46 that constitutes an electromagnet; 45, a center axis of the conductor 46 that constitutes the electromagnet; 47, lines of magnetic force of a static magnetic field developed by the electromagnet 46; and 42 and 51, conductors that receive the Lorentz's force from the static magnetic field which are wires of the present invention. Reference numeral 48 denotes a DC power source that allows a current to flow into the electromagnet, and 49 and 52 are DC power sources that allow a current to flow into the conductors 42 and 51, respectively. The conductor 46 is wound on the Si wafer 6 through the chuck 44 with the center axis 45 as a center. It is desirable that the center axis 45 is conductive to strengthen the static magnetic field 47. A direct current is made to flow from the DC power source 48 as shown in FIGS. 16A and 16B, thereby developing the static magnetic field 47 such that the Si wafer 2 side is N, and the chuck 44 side is S. The conductor 42 is wound around the bonded substrate at least once around so that it is inserted into a space formed between the Si wafer 2 and the Si wafer 6 as shown in FIG. 16B. Further, the conductor 51 is wound around the bonded substrate at least once around so that it is inserted into a space formed between the Si wafer 2 and the Si wafer 6 as shown in FIG. 16B. Then, currents are made to flow into the conductors 42 and 51 in directions opposite to each other by the DC power sources 49 and 52 as shown in FIGS. 16A and 16B. As a result, the conductor 42 receives a Lorentz's force from the static magnetic field 47 to give a force in such a direction as to peel off the Si wafer 2 from the Si wafer 6. Also, the conductor 51 receives a Lorentz's force from the static magnetic field 47 to give a force in such a direction to peel off the Si wafer 6 from the Si wafer 2. In other words, when viewed in the cross-sectional view of FIG. 16B, the Si wafer 2 receives a force upward from the conductor 42, and the Si wafer 6 receives a force downward from the conductor 42. As a result, a crack occurs in the porous Si layer 3 having the weakest bonding force between the Si wafer 2 and the Si wafer 6, thereby separating the substrate 2 to be reused from the substrate 4, 6 and 7 which forms an SOI substrate.

(Eighth Embodiment)

The eighth embodiment is directed to a mode of producing an SOI substrate in which, in order that an article ATC is separated into an Si wafer to be reused and an SOI substrate at a porous Si layer, a wire wound around a substrate is merely tightened up to give a separation force to the substrate. As the occasion demands, the wire may be heated by supplying a current to the wire.

Figure 17A:
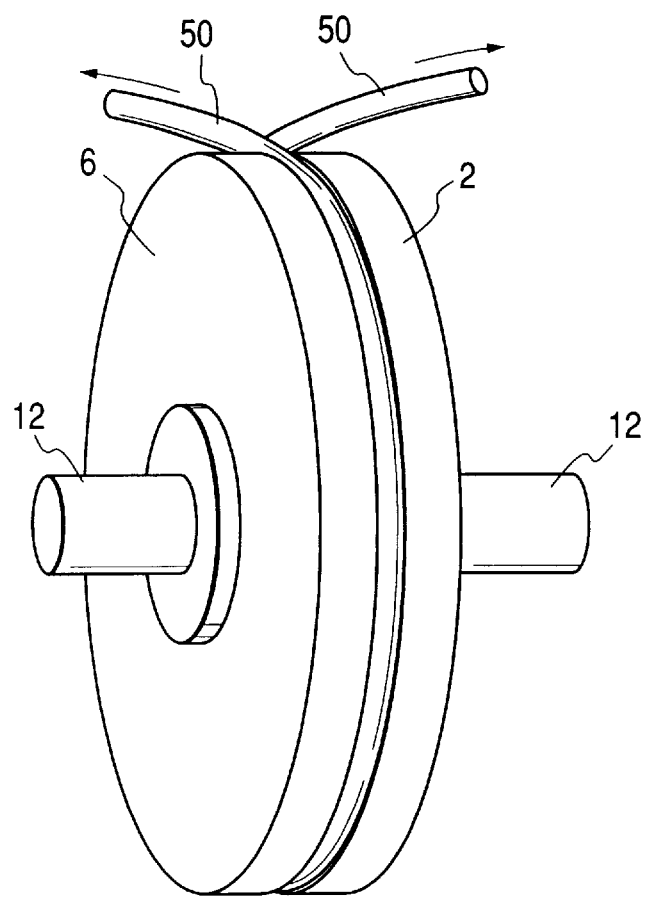
FIGS. 17A and 17B are views showing a separating process according to an eighth embodiment of the present invention where a wire is tightened up.
Figure 17B:
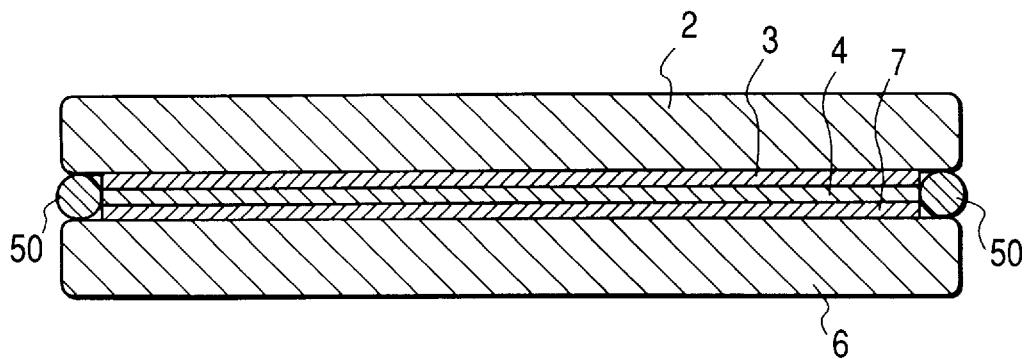

FIGS. 17A and 17B are views showing a separating process of the eighth embodiment, in which FIG. 17A is a perspective view of the substrate, and FIG. 17B is a cross-sectional view of the substrate, respectively. In the figures, reference numeral 50 denotes a wire that is thin but difficult to cut off, which is inserted into a space formed between the Si wafer 2 and the Si wafer 6 and then wound. The reference numerals indicating the same parts as those described in the above represent identical parts. As shown in FIGS. 17A and 17B, the wire 50 is wound around the bonded substrate and then tightened up in the directions indicated by arrows, as a result of which a crack occurs in the porous Si layer 3 which is weakest in bonding force between the Si wafer 2 and the Si wafer 6. In this example, it is more preferable that a current is made to flow into the wire 50 so that the wire 50 is heated. As a result, the substrate 2 to be reused can be separated from the substrate 4, 6 and 7 which form an SOI substrate.

(Ninth Embodiment)

Figure 18A:
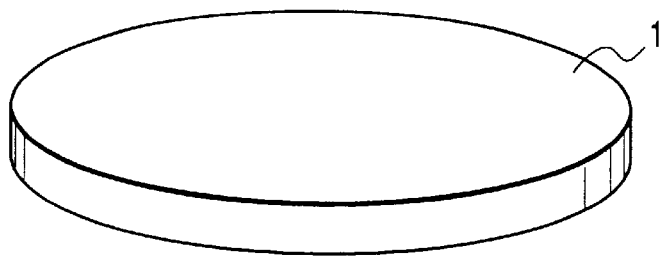
FIGS. 18A, 18B and 18C are views showing a process of producing a single crystal Si solar cell.
Figure 18B:
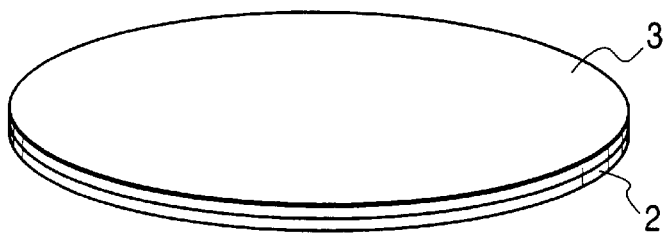
Figure 18C:
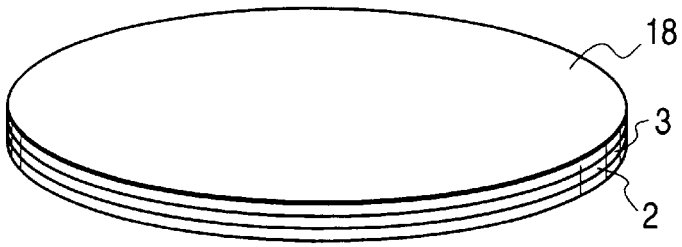

The ninth embodiment is directed to a mode of producing a solar cell. FIGS. 18A to 18C are views showing processes conducted until a photoelectric conversion layer that converts light into electricity is formed. First, as shown in FIG. 18A, a p-type Si wafer 1 is prepared, and a surface of the Si wafer 1 is made porous through the same anodization process as described with reference to FIG. 3. As a result, as shown in FIG. 18B, there can be provided a substrate having a porous Si layer 3 on a nonporous Si layer 2. Then, as shown in FIG. 18C, an epitaxial Si layer that forms a photoelectric conversion layer 18 is formed on the porous Si layer 3 through a method such as molecular beam epitaxial growth, plasma CVD, low pressure CVD, photo CVD, bias sputtering, liquid phase growth, or the like.

Figure 19:
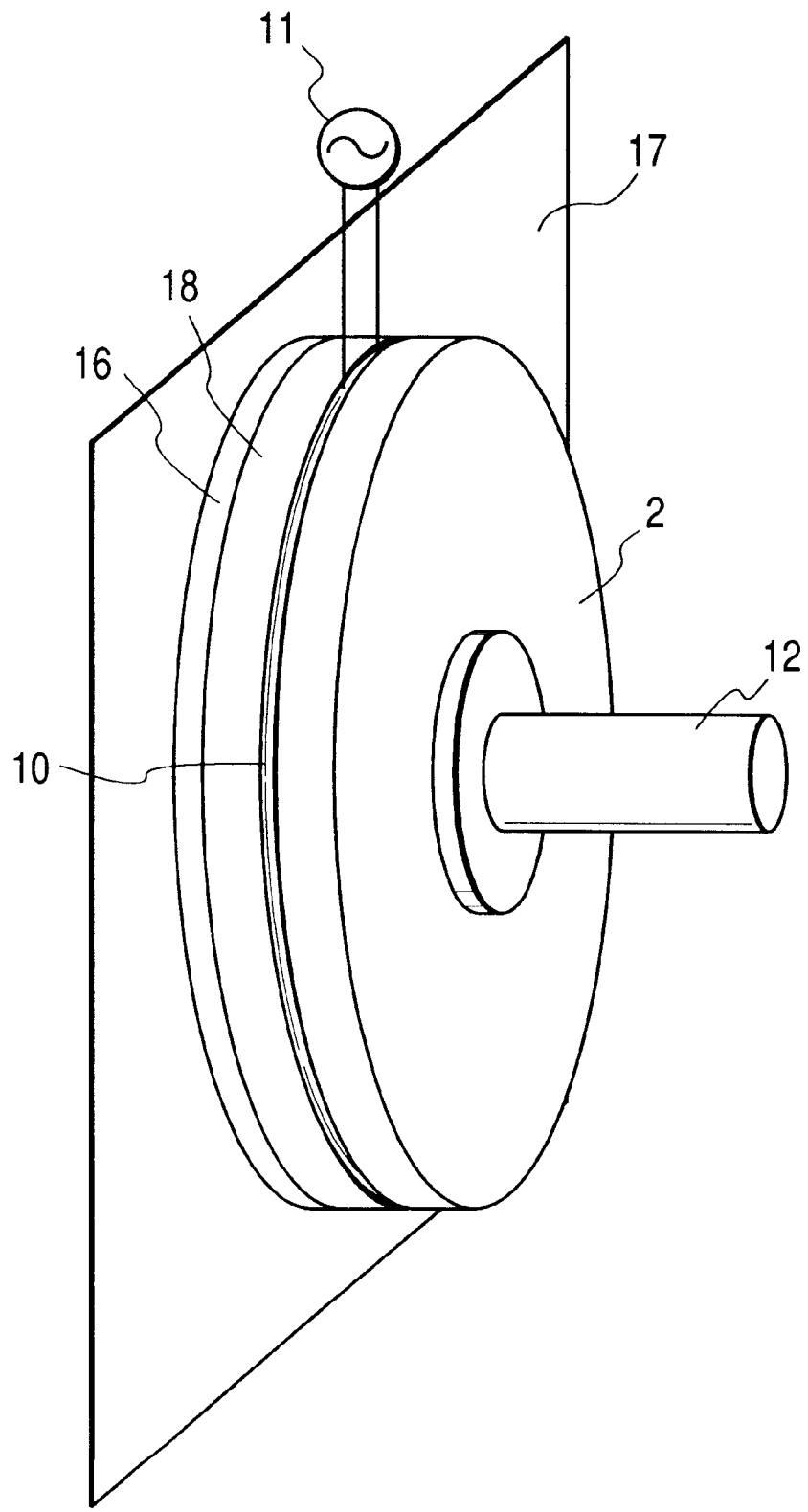
FIG. 19 is a view showing a separating process for producing a single crystal Si solar cell.
Figure 20:
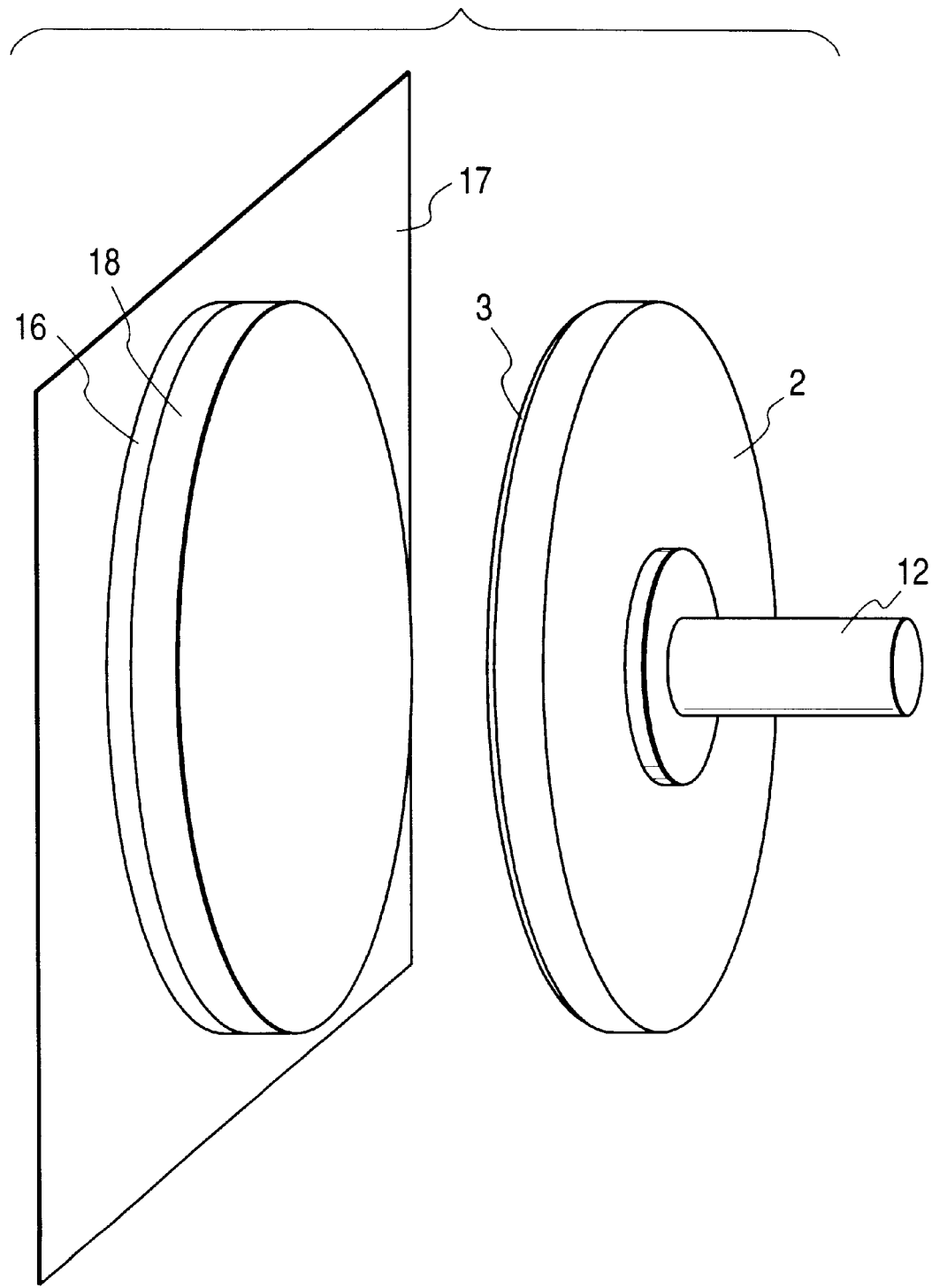
FIG. 20 is a view showing a substrate after separation.
Figure 22A:
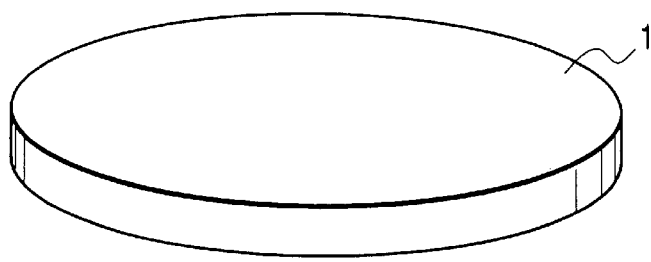
FIGS. 22A, 22B, 22C, 22D and 22E are views showing a conventional process of producing an SOI substrate.
Figure 22B:
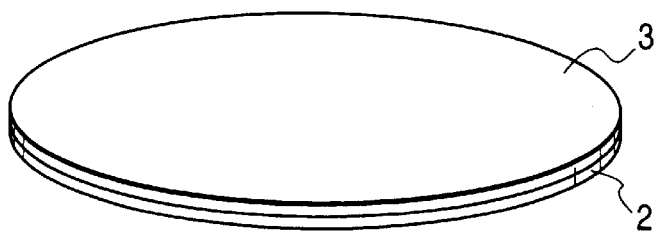
Figure 22C:
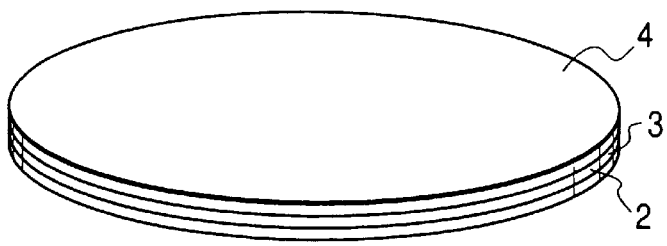
Figure 22D:
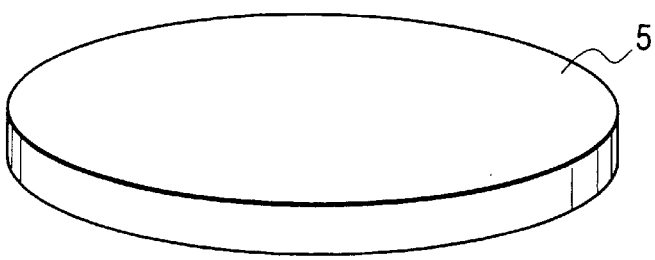
Figure 22E:
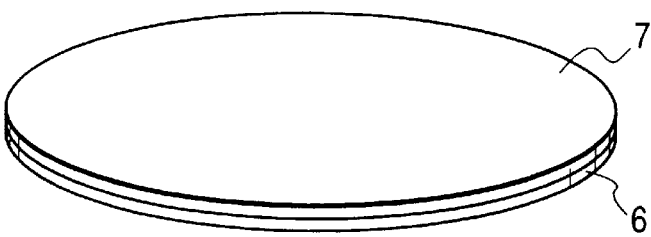
Figure 23A:
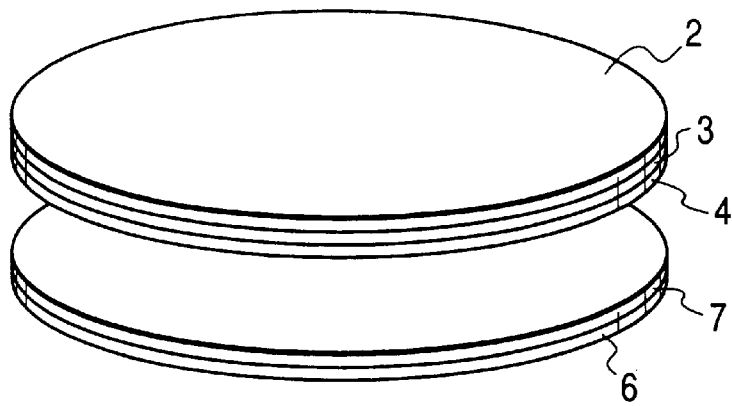
FIGS. 23A, 23B, 23C and 23D are views showing a conventional process of producing an SOI substrate.
Figure 23B:
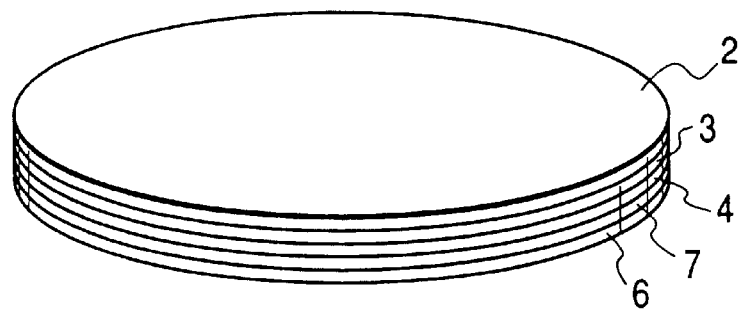
Figure 23C:
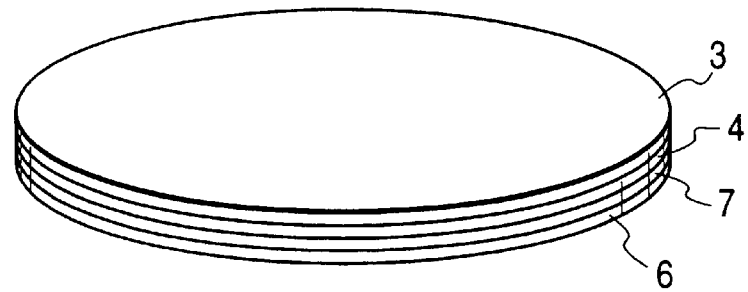
Figure 23D:
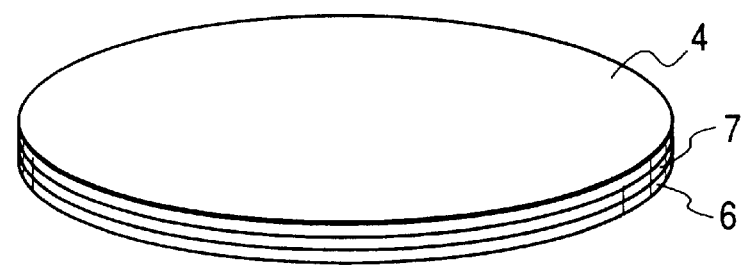
Figure 24:
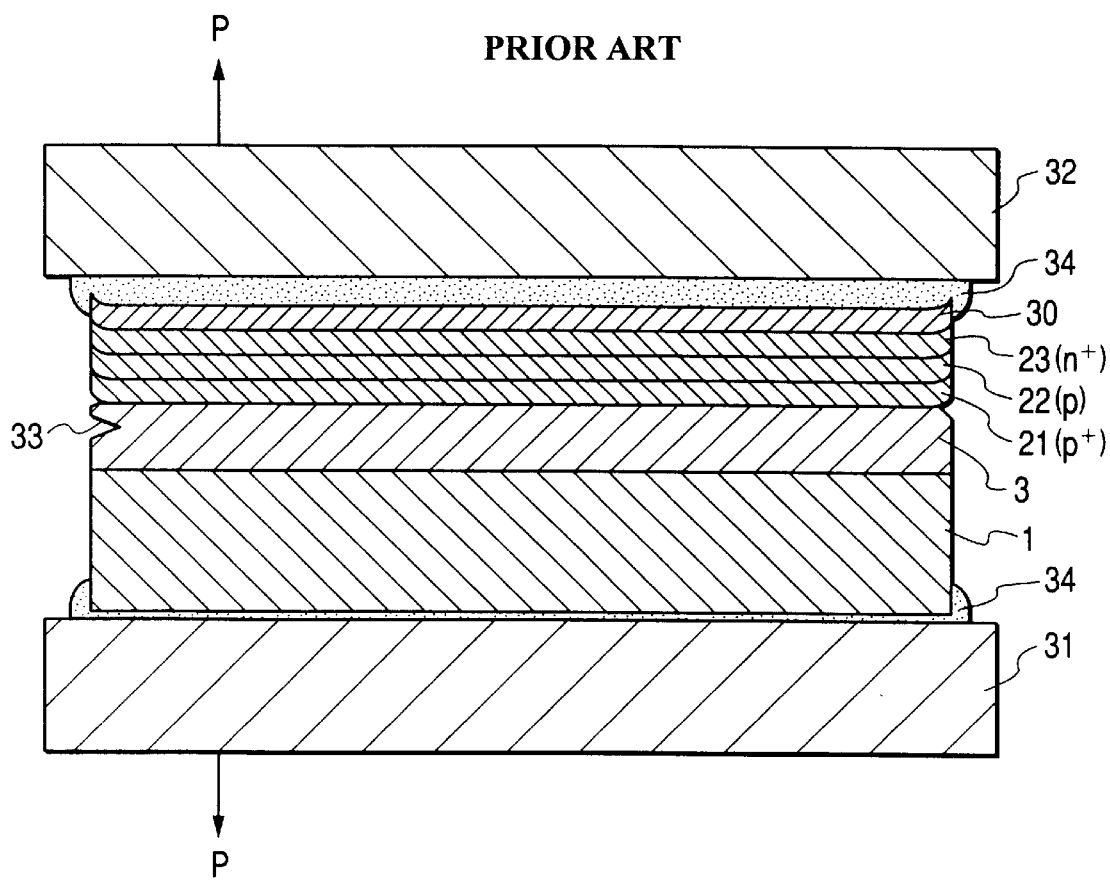
FIG. 24 is a view showing a structure of a conventional solar cell.

FIGS. 19 and 20 are perspective views showing a separating process according to a ninth embodiment of the present invention. FIGS. 21A and 21B are a perspective view of a final product solar cell and a cross-sectional view taken along a line 21B—21B of FIG. 21A. In those figures, reference numeral 16 denotes a rear-surface metal electrode; 17, a plastic substrate; 18, a photoelectric conversion layer; 19, a front-surface metal electrode; 20, a protective film; and 24, wirings. The same parts as those already described are indicated by identical reference numerals.

When the photoelectric conversion layer 18 is formed in this embodiment, in order that a pn junction is formed as shown in FIG. 21B, an n$^+$ layer 23, a p layer 22 and a p$^+$ layer 21 are formed in this order downward during the epitaxial growth step of FIG. 18C. Then, as shown in FIG. 19, the photoelectric conversion layer 18 is bonded to the rear-surface metal electrode 16 which is closely adhered to the plastic substrate 17. In this state, the p$^+$ layer 21 as the outermost surface is brought into contact with the rear-surface metal electrode 16. Thereafter, a vacuum chuck 12 is brought in close contact with the outside of the nonporous Si layer 2. Then, in the same manner as in the first embodiment, a nichrome wire 10 is wound so that it fills up a space formed between the side surfaces of the Si wafer 2 and the rear-surface metal electrode 16, and a current is made to flow into the nichrome wire 10 from an AC power source 11. As a result, heat is partially given to the porous Si layer 3, thereby separating the substrate 18, 16 and 17 which finally form a solar cell from the Si wafer to be reused in another production process at the porous Si layer 3. This separating process was described as a process of giving heat using a nichrome wire as with the first embodiment, however any mode of the second to eighth embodiments may be used.

Thereafter, as shown in FIG. 21A, a front-surface metal electrode 19 is formed on a front surface of the photoelectric conversion layer 18. Then, the wirings 24 are connected to the front-surface metal electrode 19 and to the rear-surface metal electrode 16, and the protective layer 20 is formed on the front-surface metal electrode 19. FIG. 21B is a cross-sectional view taken along the line 21B—21B of FIG. 21A. The photoelectric conversion layer 18 is constituted of the n$^+$ layer 23 which is in contact with the front-surface metal electrode 19, a p layer 22, and a p$^+$ layer 21 which is in contact with the rear-surface metal electrode 16 from the top. The front-surface metal electrode 19 is preferably in the form of a mesh that allows the transmission of light. However, it may be replaced by a transparent electrode such as an ITO electrode. Further, since the rear-surface metal electrode 16 also acts to return light not converted into electricity during passing through the photoelectric conversion layer 18 to the photoelectric conversion layer 18 again, it is desirable that the rear-surface metal electrode 16 is formed of a metal material with a large reflectance.

This embodiment is excellent in conversion efficiency, lifetime, production cost, and the like because several single crystal thin film solar cells can be formed from one Si wafer. Also, since a local heat application is used to cause a strain in the crystal of the porous Si layer to thereby attain separation of the substrate, no strong pulling force is required. For that reason, since any strong adhesion between a substrate and a jig or the like is not required, this embodiment is excellent in production cost.

(Tenth Embodiment)

The tenth embodiment is directed to a mode of producing a solar cell as is the case with the ninth embodiment. In the ninth embodiment, the photoelectric conversion layer 18 shown in FIGS. 18 to 21B is comprised of an epitaxial Si layer formed on the porous Si layer 3. However, in the tenth embodiment, a porous Si layer with a small porosity is employed for the photoelectric conversion layer 18. It was explained with reference to the first embodiment that changing the current density during the anodization step changes the porosity of a porous Si layer. In other words, it was explained that as the current density of a current that flows from the electrode 28 to the electrode 29 is made large during the anodization step described with reference to FIG. 3, the porosity of the porous Si layer formed on the Si wafer 1 becomes larger. Using this phenomenon, when the surface of the p$^+$ type Si wafer 1 is made porous, as shown in FIG. 4, a small current density is adopted to form a porous Si layer 3a with a small porosity, under which a porous Si layer 3b with a large porosity is formed on a nonporous Si layer 2. Then, P, As or the like which forms n-type is ion-implanted into the uppermost surface of the porous Si layer 3a of a small porosity, so that the porous Si layer 3a is used as the photoelectric conversion layer 18 having the pn junction formed therein of FIG. 21B.

Thereafter, as shown in FIG. 19, the porous Si layer 3a of a small porosity which is to be used as the photoelectric conversion layer 18 is bonded to the rear-surface metal electrode 16. The other steps are identical with those of the eighth embodiment. This embodiment is excellent in conversion efficiency, lifetime, production cost, and the like because several single crystal thin film solar cells can be formed from one Si wafer. Also, since no epitaxial growth step is adopted, the production cost is lower than that of the eighth embodiment. Further, since the photoelectric conversion layer 18 is formed of a porous Si layer small in porosity, single-crystallinity is maintained. Further, since light is properly scattered by the pores, the conversion efficiency is also enhanced.

(Eleventh Embodiment)

The eleventh embodiment is directed to a mode of producing an area sensor. In this embodiment, a photoelectric conversion layer of a single crystal thin film is formed from an Si wafer as is the case with the ninth and the tenth embodiments. Then, a photosensor is disposed two-dimensionally on the photoelectric conversion layer and is provided with a matrix wiring. The matrix wiring is designed, for example, such that column wirings are provided instead of arranging the front-surface metal electrode 19, and row wirings are provided instead of arranging the rear-surface metal electrode 16, in the embodiment shown in FIGS. 21A and 21B. This embodiment is excellent in conversion efficiency, lifetime, production cost, adoptability of a large area and so on because several single crystal thin film area sensors can be formed from one Si wafer.

(Twelfth Embodiment)

First, an Si wafer is prepared as one substrate.

Then, the Si wafer is located in an ion implanter so that hydrogen ions or rare gas ions are implanted in the entire surface of the Si wafer so that they reach a given depth. In this way, a defective layer is formed inside of the Si wafer due to microbubbles.

On the other hand, another Si wafer is prepared as a support substrate, and its surface is oxidized and is bonded to the surface of the Si wafer having the defective layer caused by the microbubbles.

An article thus formed of the bonded wafers is separated into both the wafers by bringing a wire into contact with a side surface of the article in the vicinity of the defective layer caused by the microbubbles and breaking the defective layer through the processes shown in FIGS. 1A and 1B, 9A and 9B, 10A and 10B, 12A and 12B, 14A and 14B, 15A and 15B, 16A and 16B, 17A and 17B and 19.

In this way, the single crystal Si layer on the defective layer of the Si wafer which is the one substrate is transferred onto the silicon oxide film of the other substrate.

The above-mentioned generation of the microbubbles due to ion implantation is described in detail in U.S. Pat. No. 5,374,564.

The above description is made using the Si wafer as one example. However, the present invention is applicable to semiconductors other than Si such as SiGe, Ge, SiC, GaAs, InP and so on.

As described above, according to the present invention, a large number of single crystal thin film Si solar cells can be obtained from one Si substrate using one wire. Also, since a wire acting upon the entire circumference of a substrate is used for separation, the substrate can be separated efficiently, and an Si thin film of a high quality can be provided without giving any damage to the Si thin film. For that reason, when an SOI substrate is produced, since the material can be used without any waste, there can be provided a production process which can reduce production cost and save resources. Further, the SOI substrate itself as produced has a high quality. Similarly, when a photoelectric conversion device is produced, since the material can be used without any waste, there can be provided a production process capable of reducing production cost and saving resources. Also, the SOI substrate per se as produced has a high quality.

What is claimed is:

1. A process for forming a thin film which prepares a substrate having a porous layer on a nonporous layer and further having on the porous layer a layer smaller in porosity than the porous layer, and separates the nonporous layer and the layer smaller in porosity by the porous layer, the process comprising bringing a wire into contact with a side surface of the substrate to effect the separation.

2. The process as claimed in claim 1, wherein the wire is wound on the side surface of the substrate least once around.

3. The process as claimed in claim 2, wherein the wire is electrically conductive, and wherein a current is allowed to flow into the wire to generate heat from the wire.

4. The process as claimed in claim 2, wherein the wire is electrically conductive, and wherein a current is allowed to flow into the wire to thermally expand the wire.

5. The process as claimed in claim 2, wherein the wire is electrically conductive, and wherein a current is allowed to flow into the wire while applying a magnetic field to the outside of the wire, thereby exerting the Lorentz's force on the wire.

6. The process as claimed in claim 5, wherein the magnetic field is a static magnetic field, and wherein an alternating current is allowed to flow into the wire to vibrate the wire.

7. The process as claimed in claim 5, wherein the magnetic field is a static magnetic field, and wherein a direct current is allowed to flow into the wire to exert a force on the substrate from the wire in a direction of peeling off the layer smaller in porosity.

8. The process as claimed in claim 2, wherein the wire is tightened up to separate the substrate.

9. The process as claimed in claim 1, wherein the wire is a bimetal, and wherein the wire is heated to be thermally deformed to conduct the separation.

10. The process as claimed in claim 1, wherein the wire is a shape-memory alloy, and wherein the wire is deformed by using the shape-memory of the wire to conduct the separation.

11. The process as claimed in claim 1, wherein the porous layer on the nonporous layer is formed by anodization of an Si wafer.

12. The process as claimed in claim 1, wherein a rear surface of the nonporous layer which is not in contact with the porous layer is brought into close contact with a vacuum chuck, and wherein a small pulling force is propagated to the substrate from the vacuum chuck.

13. The process as claimed in claim 11, wherein the layer smaller in porosity is a nonporous epitaxial layer formed by epitaxial growth on the porous layer.

14. The process as claimed in claim 13, wherein after the epitaxial layer and a support substrate having an insulating layer at least on a surface thereof are bonded to each other, separation is performed by the porous layer, and the porous layer remaining on the epitaxial layer is removed to use the epitaxial layer and the insulating layer for a semiconductor layer and an underlying insulating layer of an SOI substrate, respectively.

15. The process as claimed in claim 14, wherein the support substrate having an insulating layer at least on a surface thereof is a substrate obtained by oxidizing a surface of an Si wafer.

16. The process as claimed in claim 11, wherein after an insulating layer is formed on a surface of the epitaxial layer and the insulating layer is bonded to a support substrate, separation is performed by the porous Si layer, and the porous layer remaining on the epitaxial layer is removed to use the epitaxial layer and the insulating layer for a semiconductor layer and an underlying insulating layer of an SOI substrate, respectively.

17. The process as claimed in claim 16, wherein the support substrate is a quartz substrate.

18. The process as claimed in claim 16, wherein the support substrate is a substrate obtained by oxidizing a surface of an Si wafer.

19. The process as claimed in claim 11, wherein the layer smaller in porosity is formed by conducting anodization at a smaller current density than that used when forming the porous layer.

20. The process as claimed in claim 14 or 19, wherein after the layer smaller in porosity and the support substrate are bonded to each other, separation is performed by the porous layer to use the layer small in porosity for the photoelectric conversion layer of a photoelectric conversion device.

21. A process for forming a thin film which prepares a substrate having a porous Si layer on a nonporous Si layer and further having on the porous Si layer an Si layer smaller in porosity than the porous Si layer, and separates the nonporous Si layer and the Si layer smaller in porosity by the porous Si layer, the process comprising bringing a wire into contact with a side surface of the substrate to effect the separation.

22. The process as claimed in claim 21, wherein the wire is wound on the side surface of the substrate at least once around.

23. The process as claimed in claim 22, wherein the wire is electrically conductive, and wherein a current is allowed to flow into the wire to generate heat from the wire.

24. The process as claimed in claim 22, wherein the wire is electrically conductive, and wherein a current is allowed to flow into the wire to thermally expand the wire.

25. The process as claimed in claim 22, wherein the wire is electrically conductive, and wherein a current is allowed to flow into the wire while applying a magnetic field to the outside of the wire, thereby exerting the Lorentz's force on the wire.

26. The process as claimed in claim 25, wherein the magnetic field is a static magnetic field, and wherein an alternating current is allowed to flow into the wire to vibrate the wire.

27. The process as claimed in claim 25, wherein the magnetic field is a static magnetic field, and wherein a direct current is allowed to flow into the wire to exert a force on the substrate from the wire in a direction of peeling off the layer smaller in porosity.

28. The process as claimed in claim 22, wherein the wire is tightened up to separate the substrate.

29. The process as claimed in claim 21, wherein the wire is a bimetal, and wherein the wire is heated to be thermally deformed to conduct the separation.

30. The process as claimed in claim 21, wherein the wire is a shape-memory alloy, and wherein the wire is deformed by using the shape-memory of the wire to conduct the separation.

31. The process as claimed in claim 21, wherein the porous Si layer on the nonporous Si layer is formed by anodization of an Si wafer.

32. The process as claimed in claim 21, wherein a rear surface of the nonporous Si layer which is not in contact with the porous Si layer is brought into close contact with a vacuum chuck, and wherein a small pulling force is propagated to the substrate from the vacuum chuck.

33. The process as claimed in claim 31, wherein the Si layer smaller in porosity is an epitaxial Si layer formed by epitaxial growth on the porous Si layer.

34. The process as claimed in claim 33, wherein after the epitaxial Si layer and a support substrate having an insulating layer at least on a surface thereof are bonded to each other, separation is performed by the porous Si layer, and the porous Si layer remaining on the epitaxial Si layer is removed to use the epitaxial Si layer and the insulating layer for a semiconductor layer and an underlying insulating layer of an SOI substrate, respectively.

35. The process as claimed in claim 34, wherein the support substrate having an insulating layer at least on a surface thereof is a substrate obtained by oxidizing a surface of an Si wafer.

36. The process as claimed in claim 31, wherein after an insulating layer is formed on a surface of the epitaxial Si layer and the insulating layer is bonded to a support substrate, separation is performed by the porous Si layer, and the porous Si layer remaining on the epitaxial Si layer is removed to use the epitaxial Si layer and the insulating layer for a semiconductor layer and an underlying insulating layer of an SOI substrate, respectively.

37. The process as claimed in claim 36, wherein the support substrate is a quartz substrate.

38. The process as claimed in claim 36, wherein the support substrate is a substrate obtained by oxidizing a surface of an Si wafer.

39. The process as claimed in claim 31, wherein the Si layer smaller in porosity is formed by conducting anodization at a smaller current density than that used when forming the porous Si layer.

40. The process as claimed in claim 34 or 39, wherein after the Si layer small in porosity and the support substrate are bonded to each other, separation is performed by the porous Si layer to use the Si layer small in porosity for the photoelectric conversion layer of a photoelectric conversion device.

41. A process for forming a thin film, comprising the steps of:
   implanting hydrogen ions or rare gas ions into first substrate to form an ion-implanted layer inside the first substrate;
   bonding the first substrate and a second substrate to each other; and
   bringing a wire into contact with a side surface of the bonded first and second substrates to effect separation by the ion-implanted layer.

42. A process for forming a thin film, comprising the steps of:
   implanting hydrogen ions or rare gas ions into a silicon substrate to form a defective layer containing microbubbles inside the silicon substrate;
   bonding the silicon substrate and another substrate to each other; and
   bringing a wire into contact with a side surface of the bonded substrates to effect separation by the defective layer containing microbubbles.

43. The process as claimed in claim 42, wherein the wire is wound on the side surface at least once around.

44. The process as claimed in claim 43, wherein the wire is electrically conductive, and wherein a current is allowed to flow into the wire to generate heat from the wire.

45. The process as claimed in claim 43, wherein the wire is electrically conductive, and wherein a current is allowed to flow into the wire to thermally expand the wire.

46. The process as claimed in claim 43, wherein the wire is electrically conductive, and wherein a current is allowed to flow into the wire while applying a magnetic field to the outside of the wire, thereby exerting the Lorentz's force on the wire.

47. The process as calimed in claim 46, wherein the magnetic field is a static magnetic field, and wherein an alternating current is allowed to flow into the wire to vibrate the wire.

48. The process as claimed in claim 46, wherein the magnetic field is a static magnetic field, and wherein a direct current is allowed to flow into the wire.

49. The process as claimed in claim 43, wherein the wire is tightened up.

50. The process as claimed in claim 42, wherein the wire is a bimetal, and wherein the wire is heated to be thermally deformed to conduct the separation.

51. The process as claimed in claim 42, wherein the wire is a shape-memory alloy, and wherein the wire is deformed by using the shape-memory of the wire to conduct the separation.

* * * * *

UNITED STATES PATENT AND TRADEMARK OFFICE
CERTIFICATE OF CORRECTION

PATENT NO. : 6,140,209
DATED : October 31, 2000
INVENTOR(S) : Masaaki Iwane et al.

It is certified that error appears in the above-identified patent and that said Letters Patent is hereby corrected as shown below:

<u>Title page,</u>
Item 57, ABSTRACT,
Lines 9 and 10, "small" should read -- smaller --; and
Line 16, "substrate" should read -- substrate, --.

<u>Column 1,</u>
Line 66, "sharing" should read -- shearing --.

<u>Column 2,</u>
Line 39, "above" should read -- above, --; and
Line 53, "resource" should read -- resources --.

<u>Column 3,</u>
Line 19, "small" should read -- smaller --.

<u>Column 7,</u>
Line 7, "like," should read -- the like, --.

<u>Column 17,</u>
Line 15, "small" should read -- smaller --.

<u>Column 18,</u>
Lines 29 and 31, "small" should read -- smaller --; and
Line 36, "first" should read -- a first --.

<u>Column 19,</u>
Line 1, "calimed" should read -- claimed --.

Signed and Sealed this

Twelfth Day of February, 2002

Attest:

*Attesting Officer*

JAMES E. ROGAN
*Director of the United States Patent and Trademark Office*